United States Patent
Lee

(10) Patent No.: US 11,678,534 B2
(45) Date of Patent: Jun. 13, 2023

(54) DISPLAY DEVICE

(71) Applicant: SAMSUNG DISPLAY CO., LTD., Yongin-si (KR)

(72) Inventor: Hyeonbum Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 274 days.

(21) Appl. No.: 17/038,530

(22) Filed: Sep. 30, 2020

(65) Prior Publication Data

US 2021/0193779 A1   Jun. 24, 2021

(30) Foreign Application Priority Data

Dec. 24, 2019 (KR) .......................... 10-2019-0174146

(51) Int. Cl.
*H01L 27/32* (2006.01)

(52) U.S. Cl.
CPC .................................. *H01L 27/3276* (2013.01)

(58) Field of Classification Search
None
See application file for complete search history.

(56) References Cited

U.S. PATENT DOCUMENTS

| 9,095,017 | B2   | 7/2015  | Yi et al. |
| 9,847,055 | B2   | 12/2017 | Kim et al. |
| 9,941,339 | B2 * | 4/2018  | Her ...................... G09G 3/3233 |

(Continued)

FOREIGN PATENT DOCUMENTS

| KR | 1020160017328 A | 2/2016 |
| KR | 1020160038182 A | 4/2016 |

(Continued)

*Primary Examiner* — Ali Naraghi
*Assistant Examiner* — Siangluai Mang
(74) *Attorney, Agent, or Firm* — Cantor Colburn LLP

(57) ABSTRACT

A display device includes a $1\text{-}1^{st}$ wiring including a $1\text{-}1^{st}$ end at an end portion thereof in a first direction, a $1\text{-}2^{nd}$ wiring extending in a second direction opposite to the first direction and including a $1\text{-}2^{nd}$ end that is apart from the $1\text{-}1^{st}$ end, a second wiring that is apart from the $1\text{-}1^{st}$ wiring and the $1\text{-}2^{nd}$ wiring, a first bridge wiring in contact with the $1\text{-}1^{st}$ wiring and the $1\text{-}2^{nd}$ wiring and electrically connecting the $1\text{-}1^{st}$ wiring to the $1\text{-}2^{nd}$ wiring, and a third wiring extending in the first direction and disposed such that the second wiring is between the $1\text{-}1^{st}$ wiring and the third wiring. The first bridge wiring has a convex shape in a direction opposite to a direction from the $1\text{-}1^{st}$ wiring and the $1\text{-}2^{nd}$ wiring to the second wiring.

9 Claims, 18 Drawing Sheets

(56) References Cited

U.S. PATENT DOCUMENTS

| | | | |
|---|---|---|---|
| 2009/0058764 A1* | 3/2009 | Imai | G09G 3/20 |
| | | | 345/55 |
| 2014/0055028 A1* | 2/2014 | Yi | H05B 33/04 |
| | | | 313/498 |
| 2016/0035805 A1* | 2/2016 | Kim | H01L 51/5209 |
| | | | 345/76 |
| 2016/0181350 A1* | 6/2016 | Lee | H01L 51/5212 |
| | | | 438/34 |
| 2017/0170248 A1* | 6/2017 | Sato | H01L 27/3258 |
| 2017/0179210 A1* | 6/2017 | Kimura | H01L 27/3258 |
| 2018/0047802 A1* | 2/2018 | Yoon | H01L 27/3276 |
| 2018/0059869 A1* | 3/2018 | Ma | G06F 3/0447 |
| 2018/0182827 A1* | 6/2018 | Kim | H01L 27/3218 |
| 2018/0366494 A1* | 12/2018 | Lee | H01L 27/1259 |
| 2019/0079621 A1* | 3/2019 | Yoshida | G06F 3/044 |
| 2019/0189731 A1* | 6/2019 | Managaki | H01L 27/3276 |
| 2021/0193779 A1* | 6/2021 | Lee | H01L 27/3276 |

FOREIGN PATENT DOCUMENTS

| | | |
|---|---|---|
| KR | 1020180003707 A | 1/2018 |
| KR | 1020180075958 A | 7/2018 |
| KR | 1020190035646 A | 4/2019 |

\* cited by examiner

DISPLAY DEVICE

This application claims priority to Korean Patent Application No. 10-2019-0174146, filed on Dec. 24, 2019, and all the benefits accruing therefrom under 35 U.S.C. § 119, the content of which in its entirety is herein incorporated by reference.

BACKGROUND

1. Field

Exemplary embodiments relate to a display device, and more particularly, to a display device that may reduce the degree of occurrence of a color band caused by external light reflection.

2. Description of Related Art

Generally, display devices are used under various environments. Therefore, the display devices may be used while an external light source is present. Particularly, in a case where the display devices are used in mobile apparatuses, there is a high possibility that the display devices are used under an environment in which external light is provided.

SUMMARY

In a display device of a related art, external light is reflected by the display device and a color band may be viewed.

Exemplary embodiments include a display device which may reduce a degree of the occurrence of a color band by external light reflection. However, it should be understood that embodiments described herein should be considered in a descriptive sense only and not for limitation of the invention.

Additional features will be set forth in part in the description which follows and, in part, will be apparent from the description, or may be learned by practice of the presented exemplary embodiments of the invention.

An exemplary embodiment of a display device includes a $1\text{-}1^{st}$ wiring disposed over a first insulating layer, extending in a first direction and including a $1\text{-}1^{st}$ end at an end portion thereof in the first direction, a $1\text{-}2^{nd}$ wiring disposed over the first insulating layer, extending in a second direction opposite to the first direction and including a $1\text{-}2^{nd}$ end that faces the $1\text{-}1^{st}$ end, the 1-2' end being apart from the $1\text{-}1^{st}$ end, a second wiring disposed over the first insulating layer, extending in the first direction and corresponding to the $1\text{-}1^{st}$ wiring and the $1\text{-}2^{nd}$ wiring, the second wiring being apart from the $1\text{-}1^{st}$ wiring and the $1\text{-}2^{nd}$ wiring, a first bridge wiring disposed on a layer different from the first insulating layer, contacting the $1\text{-}1^{st}$ wiring and the $1\text{-}2^{nd}$ wiring, electrically connecting the $1\text{-}1^{st}$ wiring to the $1\text{-}2^{nd}$ wiring, and having a convex shape in a direction opposite to a direction from the $1\text{-}1^{st}$ wiring and the $1\text{-}2^{nd}$ wiring to the second wiring, a third wiring disposed over the first insulating layer such that the second wiring is between the third wiring and $1\text{-}1^{st}$ wiring, the third wiring extending in the first direction and corresponding to the $1\text{-}1^{st}$ wiring and the $1\text{-}2^{nd}$ wiring, a first pixel electrode including a first side disposed above the second wiring and a second side disposed above a space between the $1\text{-}1^{st}$ end and the $1\text{-}2^{nd}$ end, and a second pixel electrode including a first side disposed above the third wiring and a second side disposed above a space between the second wiring and the third wiring.

In an exemplary embodiment, the first pixel electrode may be electrically connected to the second wiring, and the second pixel electrode may be electrically connected to the third wiring.

In an exemplary embodiment, the display device may further include a $2\text{-}1^{st}$ insulating layer covering the $1\text{-}1^{st}$ wiring, the $1\text{-}2^{nd}$ wiring, the second wiring, and the third wiring, and a $2\text{-}2^{nd}$ insulating layer over the $2\text{-}1^{st}$ insulating layer, wherein the first bridge wiring may be between the $2\text{-}1^{st}$ insulating layer and the $2\text{-}2^{nd}$ insulating layer.

In an exemplary embodiment, a $2\text{-}1^{st}$ via hole and a $3\text{-}1^{st}$ via hole may be defined in the $2\text{-}1^{st}$ insulating layer, the $2\text{-}1^{st}$ via hole being defined over the second wiring, the $3\text{-}1^{st}$ via hole being defined over the third wiring, a $2\text{-}2^{nd}$ via hole and a $3\text{-}2^{nd}$ via hole may be defined in the $2\text{-}2^{nd}$ insulating layer, the $2\text{-}2^{nd}$ via hole corresponding to the $2\text{-}1^{st}$ via hole, the $3\text{-}2^{nd}$ via hole corresponding to the $3\text{-}1^{st}$ via hole, the first pixel electrode may be in contact with the second wiring through the $2\text{-}1^{st}$ via hole and the $2\text{-}2^{nd}$ via hole, and the second pixel electrode may be in contact with the third wiring through the $3\text{-}1^{st}$ via hole and the $3\text{-}2^{nd}$ via hole.

In an exemplary embodiment, the display device may further include a substrate over which the first insulating layer may be arranged, wherein an orthogonal projection image of the first pixel electrode on the substrate may not overlap an orthogonal projection image of the first bridge wiring on the substrate. An orthogonal projection image of the second pixel electrode on the substrate does not overlap an orthogonal projection image of the second wiring on the substrate.

In an exemplary embodiment, the display device may further include a second insulating layer covering the $1\text{-}1^{st}$ wiring, the $1\text{-}2^{nd}$ wiring, the second wiring, and the third wiring, wherein the first bridge wiring, the first pixel electrode, and the second pixel electrode may be arranged over the second insulating layer such that the first bridge wiring, the first pixel electrode, and the second pixel electrode do not contact one another.

In an exemplary embodiment, a second via hole defined over the second wiring and a third via hole defined over the third wiring may be defined in the second insulating layer, the first pixel electrode may be in contact with the second wiring through the second via hole, and the second pixel electrode may be in contact with the third wiring through the third via hole.

In an exemplary embodiment, the display device may further include a substrate over which the first insulating layer is arranged, wherein an orthogonal projection image of the first pixel electrode on the substrate may not overlap an orthogonal projection image of the first bridge wiring on the substrate, and an orthogonal projection image of the second pixel electrode on the substrate may not overlap an orthogonal projection image of the second wiring on the substrate.

An exemplary embodiment of a display device includes a first wiring disposed over a first insulating layer and extending in a first direction, a second wiring disposed over the first insulating layer and extending in the first direction and corresponding to the first wiring, the second wiring being apart from the first wiring, a $3\text{-}1^{st}$ wiring disposed over the first insulating layer such that the second wiring is between the $3\text{-}1^{st}$ wiring and the first wiring, the $3\text{-}1^{st}$ wiring extending in the first direction and including a $3\text{-}1^{st}$ end at an end portion thereof in the first direction, a $3\text{-}2^{nd}$ wiring disposed over the first insulating layer, extending in a second direction opposite to the first direction and including a $3\text{-}2^{nd}$ end that faces the $3\text{-}1^{st}$ end, the $3\text{-}2^{nd}$ end being apart from the $3\text{-}1^{st}$ end, a third bridge wiring disposed over a layer different from the first insulating layer, contacting the $3\text{-}1^{st}$ wiring and the $3\text{-}2^{nd}$ wiring, electrically connecting the $3\text{-}1^{st}$ wiring to the $3\text{-}2^{nd}$ wiring, and having a convex shape in a direction opposite to a direction from the $3\text{-}1^{st}$ wiring and the $3\text{-}2^{nd}$ wiring to the second wiring, a first pixel electrode including a first side disposed above the second wiring and a second side above the first wiring, and a second pixel electrode including a first side above a space between the $3\text{-}1^{st}$ end and the $3\text{-}2^{nd}$ end, and a second side above a space between the second wiring and a center of the space between the $3\text{-}1^{st}$ end and the $3\text{-}2^{nd}$ end.

In an exemplary embodiment, the first pixel electrode may be electrically connected to one of the first wiring and the second wiring, and the second pixel electrode may be electrically connected to the third bridge wiring.

In an exemplary embodiment, the display device may further include a $2\text{-}1^{st}$ insulating layer covering the first wiring, the second wiring, the $3\text{-}1^{st}$ wiring, and the $3\text{-}2^{nd}$ wiring, and a $2\text{-}2^{nd}$ insulating layer over the $2\text{-}1^{st}$ insulating layer, wherein the third bridge wiring may be between the $2\text{-}1^{st}$ insulating layer and the $2\text{-}2^{nd}$ insulating layer.

In an exemplary embodiment, a $2\text{-}1^{st}$ via hole may be defined in the $2\text{-}1^{st}$ insulating layer over the second wiring, a $2\text{-}2^{nd}$ via hole and a third via hole may be defined in the $2\text{-}2^{nd}$ insulating layer, the $2\text{-}2^{nd}$ via hole corresponding to the $2\text{-}1^{st}$ via hole, the third via hole being defined over the third bridge wiring, the first pixel electrode may be in contact with the second wiring through the $2\text{-}1^{st}$ via hole and the $2\text{-}2^{nd}$ via hole, and the second pixel electrode may be in contact with the third bridge wiring through the third via hole.

In an exemplary embodiment, the display device may further include a substrate over which the first insulating layer is arranged, wherein an orthogonal projection image of the second pixel electrode on the substrate may not overlap an orthogonal projection image of the third bridge wiring on the substrate.

In an exemplary embodiment, a virtual straight line connecting the $3\text{-}1^{st}$ wiring to the $3\text{-}2^{nd}$ wiring may pass below the first side of the second pixel electrode.

An exemplary embodiment of a display device includes a $1\text{-}1^{st}$ wiring disposed over a first insulating layer, extending in a first direction and including a $1\text{-}1^{st}$ end at an end portion thereof in the first direction, a $1\text{-}2^{nd}$ wiring disposed over the first insulating layer, extending in a second direction opposite to the first direction and including a $1\text{-}2^{nd}$ end that faces the $1\text{-}1^{st}$ end, the $1\text{-}2^{nd}$ end being apart from the $1\text{-}1^{st}$ end, a $2\text{-}1^{st}$ wiring disposed over the first insulating layer, being apart from the $1\text{-}1^{st}$ wiring and the $1\text{-}2^{nd}$ wiring, extending in the first direction and including a $2\text{-}1^{st}$ end at an end portion thereof in the first direction, a $2\text{-}2^{nd}$ wiring disposed over the first insulating layer, extending in the direction opposite to the first direction and including a $2\text{-}2^{nd}$ end that faces the $2\text{-}1^{st}$ end, the $2\text{-}2^{nd}$ end being apart from the 2-1st end, a $3\text{-}1^{st}$ wiring disposed over the first insulating layer such that the $2\text{-}1^{st}$ wiring is between the $3\text{-}1^{st}$ wiring and $1\text{-}1^{st}$ wiring, $3\text{-}1^{st}$ wiring extending in the first direction and including a $3\text{-}1^{st}$ end at an end portion thereof in the first direction, a $3\text{-}2^{nd}$ wiring disposed over the first insulating layer, extending in the direction opposite to the first direction and including a $3\text{-}2^{nd}$ end that faces the $3\text{-}1^{st}$ end, the $3\text{-}2^{nd}$ end being apart from the $3\text{-}1^{st}$ end, a first bridge wiring disposed over a layer different from the first insulating layer, contacting the 1-1st wiring and the $1\text{-}2^{nd}$ wiring, electrically connecting the $1\text{-}1^{nd}$ wiring to the $1\text{-}2^{nd}$ wiring, and having a convex shape in a direction opposite to a direction from the $1\text{-}1^{st}$ wiring and the $1\text{-}2^{nd}$ wiring to the $2\text{-}1^{st}$ wiring, a second bridge wiring disposed over a layer different from the first insulating layer, contacting the $2\text{-}1^{st}$ wiring and the $2\text{-}2^{nd}$ wiring, electrically connecting the $2\text{-}1^{st}$ wiring to the $2\text{-}2^{nd}$ wiring, and having a convex shape to a direction opposite to a direction from the $2\text{-}1^{st}$ wiring and the $2\text{-}2^{nd}$ wiring to the $1\text{-}1^{st}$ wiring, a third bridge wiring disposed over a layer different from the first insulating layer, contacting the $3\text{-}1^{st}$ wiring and the $3\text{-}2^{nd}$ wiring, electrically connecting the $3\text{-}1^{st}$ wiring to the $3\text{-}2^{nd}$ wiring, and having a convex shape to a direction opposite to a direction from the $3\text{-}1^{st}$ wiring and the $3\text{-}2^{nd}$ wiring to the $2\text{-}1^{st}$ wiring, a first pixel electrode including a first side disposed in a space between the $1\text{-}1^{st}$ end and the $1\text{-}2^{nd}$ end, and a second side disposed in a space between the $2\text{-}1^{st}$ end and the $2\text{-}2^{nd}$ end, and a second pixel electrode including a first side disposed above a space between the $3\text{-}1^{st}$ end and the $3\text{-}2^{nd}$ end, and a second side disposed above a space between the $2\text{-}1^{st}$ wiring and a center of the space between the $3\text{-}1^{st}$ end and the $3\text{-}2^{nd}$ end, or disposed above a space between the $2\text{-}2^{nd}$ wiring and the center of the space between the 3-1' end and the $3\text{-}2^{nd}$ end.

In an exemplary embodiment, the first pixel electrode may be electrically connected to the second bridge wiring, and the second pixel electrode may be electrically connected to the third bridge wiring.

In an exemplary embodiment, the display device may further include a 2-1' insulating layer covering the $1\text{-}1^{st}$ wiring, the $1\text{-}2^{nd}$ wiring, the $2\text{-}1^{st}$ wiring, the $2\text{-}2^{nd}$ wiring, the $3\text{-}1^{st}$ wiring, and the $3\text{-}2^{nd}$ wiring, and a $2\text{-}2^{nd}$ insulating layer over the $2\text{-}1^{st}$ insulating layer, wherein the first bridge wiring to the third bridge wiring may be between the $2\text{-}1^{st}$ insulating layer and the $2\text{-}2^{nd}$ insulating layer.

In an exemplary embodiment, a second via hole and a third via hole may be defined in the $2\text{-}2^{nd}$ insulating layer, the second via hole being defined over the second bridge wiring, the third via hole being defined over the third bridge wiring, the first pixel electrode may be in contact with the second bridge wiring through the second via hole, and the second pixel electrode may be in contact with the third bridge wiring through the third via hole.

In an exemplary embodiment, the display device may further include a substrate over which the first insulating layer is arranged, wherein an orthogonal projection image of the first pixel electrode on the substrate may not overlap an orthogonal projection image of the first bridge wiring on the substrate, and an orthogonal projection image of the second bridge wiring on the substrate, and an orthogonal projection image of the second pixel electrode on the substrate may not overlap an orthogonal projection image of the third bridge wiring on the substrate.

In an exemplary embodiment, a virtual straight line connecting the $3\text{-}1^{st}$ wiring to the $3\text{-}2^{nd}$ wiring may pass below the first side of the second pixel electrode.

These and/or other features will become apparent and more readily appreciated from the following description of the exemplary embodiments, the accompanying drawings, and claims.

BRIEF DESCRIPTION OF THE DRAWINGS

The above and other features and advantages of exemplary embodiments of the invention will be more apparent from the following description taken in conjunction with the accompanying drawings, in which.

DETAILED DESCRIPTION

Figure 1:
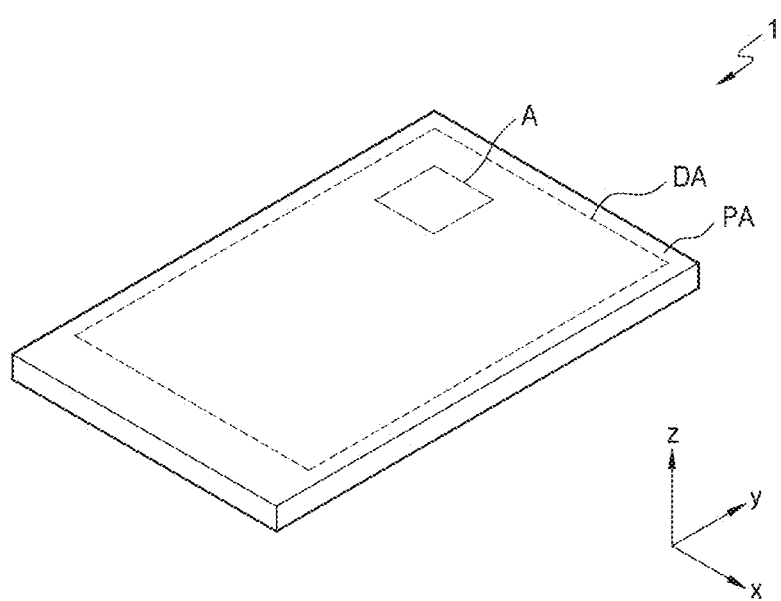
FIG. 1 is a perspective view of an exemplary embodiment of a display device.

Reference will now be made in detail to embodiments, examples of which are illustrated in the accompanying drawings, wherein like reference numerals refer to like elements throughout. In this regard, the illustrated exemplary embodiments may have different forms and should not be construed as being limited to the descriptions set forth herein. Accordingly, the exemplary embodiments are merely described below, by referring to the drawing figures, to explain features of the description. As used herein, the term "and/or" includes any and all combinations of one or more of the associated listed items. Throughout the invention, the expression "at least one of a, b or c" indicates only a, only b, only c, both a and b, both a and c, both b and c, all of a, b, and c, or variations thereof.

Hereinafter, the illustrated exemplary embodiments are described in detail with reference to the accompanying drawings. In the drawings, the same reference numerals are given to the same or corresponding elements, and repeated description thereof is omitted.

It will be understood that when a layer, region, or component is referred to as being "disposed on," another layer, region, or component, it can be directly or indirectly disposed on the other layer, region, or component. That is, for example, intervening layers, regions, or components may be present. Sizes of elements in the drawings may be exaggerated or reduced for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. The x-axis, the y-axis, and the z-axis may be perpendicular to one another, or may represent different directions that are not perpendicular to one another, for example.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
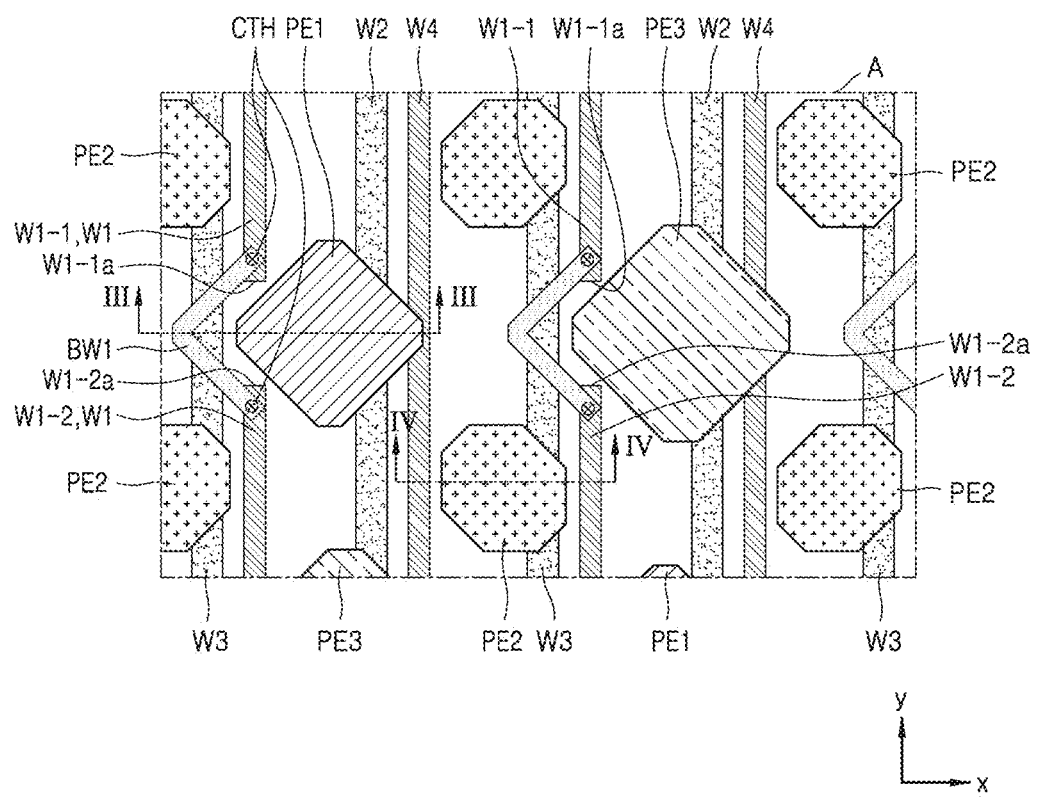
FIG. 2 is a plan view of a portion of region A of FIG. 1.
Figure 3:
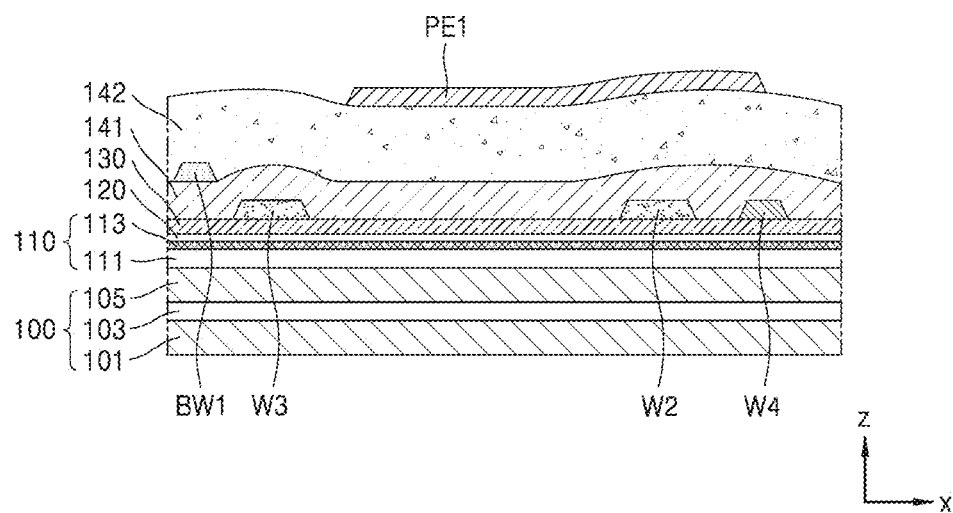
FIG. 3 is a cross-sectional view taken along line of FIG. 2.
Figure 4:
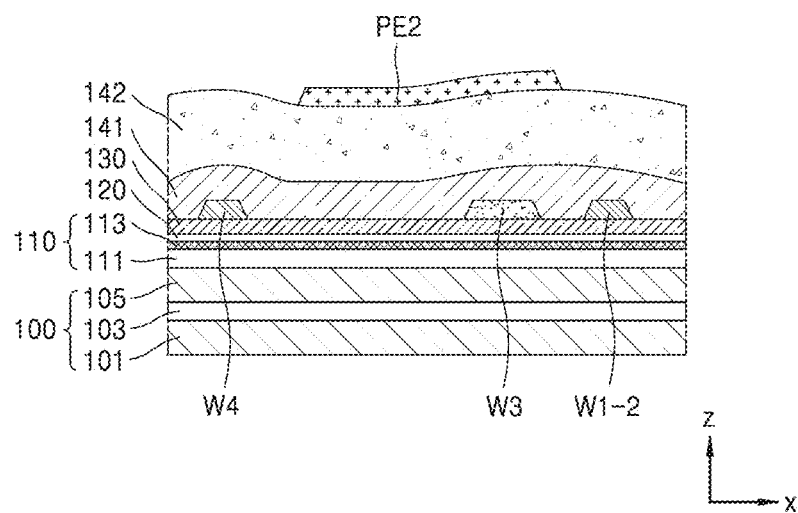
FIG. 4 is a cross-sectional view taken along line IV-IV of FIG. 2.

FIG. 1 is a perspective view of an exemplary embodiment of a display device 1, FIG. 2 is a plan view of a portion of a region A of FIG. 1, FIG. 3 is a cross-sectional view of the display device 1 taken along line of FIG. 2, and FIG. 4 is a cross-sectional view of the display device 1 taken along line IV-IV of FIG. 2.

As shown in FIG. 1, the display device 1 may include a display area DA and a peripheral area PA. The display device 1 may include a substrate 100 (refer to FIGS. 3 and 4). The substrate 100 is not limited to a rectangular shape (in an x-y plane) shown in FIG. 1 and may have various shapes such as a circle. In an alternative exemplary embodiment, the substrate 100 may have a bent area and thus be bent in the relevant bent area.

The substrate 100 may include glass or metal. In an exemplary embodiment, the substrate 100 may include various flexible or bendable materials and include, for example, a polymer resin such as polyethersulfone, polyacrylate, polyetherimide, polyethylene naphthalate, polyethylene terephthalate, polyphenylene sulfide, polyarylate, polyimide, polycarbonate, and cellulose acetate propionate. As shown in FIGS. 3 and 4, the substrate 100 may have a multi-layered structure including two layers 101 and 105 and a barrier layer 103 therebetween, the two layers 101 and 105 including the polymer resin, and the barrier layer 103 including an inorganic material. Various modifications may be made. In this case, the barrier layer 103 may include silicon oxide, silicon nitride, and/or silicon oxynitride, for example.

As shown in FIG. 2, the display device 1 may include various elements arranged in the display area DA. It is shown in FIG. 2 that the display device 1 includes a first wiring W1, a second wiring W2, a third wiring W3, a first bridge wiring BW1, a first pixel electrode PE1, and a second pixel electrode PE2. The first wiring W1 includes a 1-$1^{st}$ wiring W1-1 and a 1-$2^{nd}$ wiring W1-2. In addition, as shown in FIG. 2, the display device 1 may further include a fourth wiring W4 and a third pixel electrode PE3. Various modifications may be made.

The 1-$1^{st}$ wiring W1-1, the 1-$2^{nd}$ wiring W1-2, the second wiring W2, the third wiring W3, and the fourth wiring W4 are disposed over a first insulating layer. The first insulating layer may include an inter-insulating layer 130 (refer to FIGS. 3 and 4). There may be various layers below the inter-insulating layer 130. In an exemplary embodiment, a barrier layer 111 and a buffer layer 113 may be arranged below the inter-insulating layer 130, for example. The barrier layer 111 and the buffer layer 113 may include an inorganic material such as silicon oxide, silicon nitride, and/or silicon oxynitride. The barrier layer 111 and the buffer layer 113 may raise the flatness of a top surface of the substrate 100 or prevent or minimize the penetration of impurities from the substrate 100, etc., into an electronic element disposed thereon. The barrier layer 111 and the buffer layer 113 may be collectively referred to as an inorganic insulating layer 110.

A thin film transistor ("TFT") may be disposed over the substrate 100, and the TFT may be electrically connected to the first pixel electrode PE1 and the second pixel electrode PE2. The TFT may include a semiconductor layer, a gate electrode, a source electrode, and a drain electrode, the semiconductor layer including amorphous silicon, polycrystalline silicon, or an organic semiconductor material. The semiconductor layer may be disposed over the inorganic insulating layer 110, and the gate electrode may be disposed over the semiconductor layer. In addition, for insulation between the semiconductor layer and the gate electrode, a gate insulating layer 120 may be arranged between the semiconductor layer and the gate electrode, and the gate insulating layer 120 may include an inorganic material such as silicon oxide, silicon nitride, and/or silicon oxynitride. In addition, the inter-insulating layer 130 may be disposed over the gate electrode. The inter-insulating layer 130 may include an inorganic material such as silicon oxide, silicon nitride, and/or silicon oxynitride. The source electrode and the drain electrode may be arranged on the inter-insulating layer 130 together with the first wiring W1, the second wiring W2, etc. In an exemplary embodiment, the insulating layer including the inorganic material may be provided by chemical vapor deposition ("CVD") or an atomic layer deposition ("ALD"), for example. This is equally applied to exemplary embodiments and modifications thereof below.

The 1-$1^{st}$ wiring W1-1, the 1-$2^{nd}$ wiring W1-2, the second wiring W2, the third wiring W3, and the fourth wiring W4 may include various conductive materials and include a single-layered structure or a multi-layered structure. In an exemplary embodiment, each of the 1-$1^{st}$ wiring W1-1, the 1-$2^{nd}$ wiring W1-2, the second wiring W2, the third wiring W3, and the fourth wiring W4 may have a multi-layered structure of Ti/Al/Ti, for example.

The 1-$1^{st}$ wiring W1-1 may extend in the first direction (a −y direction) and include a 1-$1^{st}$ end W1-1a at an end portion thereof in the first direction. The 1-$2^{nd}$ wiring W1-2 may face the 1-$1^{st}$ end W1-1a by extending in a direction (a +y direction) opposite to the first direction (the −y direction). Therefore, the 1-2nd wiring W1-2 includes a 1-$2^{nd}$ end W1-2a apart from the 1-$1^{st}$ end W1-1a.

The second wiring W2 extends in the first direction (the −y direction) to correspond to the 1-$1^{st}$ wiring W1-1 and the 1-$2^{nd}$ wiring W1-2. The second wiring W2 is apart from the 1-$1^{st}$ wiring W1-1 and the 1-$2^{nd}$ wiring W1-2 (in a +x direction).

The third wiring W3 extends in the first direction (the −y direction) to correspond to the 1-$1^{st}$ wiring W1-1 and the 1-$2^{nd}$ wiring W1-2. The third wiring W3 is disposed such that the second wiring W2 is between the third wiring W3 and the 1-$1^{st}$ wiring W1-1. Therefore, the first wiring W1, the second wiring W2, and the third wiring W3 are sequentially disposed (in the +x direction). In addition, as shown in FIG. 2, a fourth wiring W4 may be disposed between the second wiring W2 and the third wiring W3. Also, the third wiring W3 may be disposed such that the first wiring W1 is between the second wiring W2 and the third wiring W3.

The first wiring W1 may include, for example, a data line, and the second wiring W2 may include, for example, a power line. That is, the first wiring W1 may include a data line which transfers a data signal to a pixel in which the first pixel electrode PE1 is disposed, and the second wiring W2 may include a power line which supplies power to a pixel in which the first pixel electrode PE1 is disposed. The fourth wiring W4 disposed between the second wiring W2 and the third wiring W3 may include, for example, a data line. The third wiring W3 may include, for example, a power line. That is, the fourth wiring W4 may include a data line which transfers a data signal to a pixel in which the second pixel electrode PE2 is disposed, and the third wiring W3 may include a power line which supplies power to a pixel in which the second pixel electrode PE2 is disposed.

As shown in FIG. 2, the first wiring W1, the second wiring W2, the fourth wiring W4, and the third wiring W3 may be repeatedly arranged in this sequence (in the +x direction). That is, the first wiring W1 and the second wiring W2 may pass across a pixel in which the third pixel electrode PE3 is disposed. The first wiring W1 may be a data line which transfers a data signal, and the second wiring W2 may be a power line which supplies power. The first wiring W1 and the second wiring W2 related to the third pixel electrode PE3 are wirings separated from the first wiring W1 and the second wiring W2 related to the first pixel electrode PE1.

The first bridge wiring BW1 is disposed on a layer different from a layer on which the 1-$1^{st}$ wiring W1-1, the 1-$2^{nd}$ wiring W1-2, the second wiring W2, the third wiring W3, and the fourth wiring W4 are disposed. That is, the 1-$1^{st}$ wiring W1-1, the 1-$2^{nd}$ wiring W1-2, the second wiring W2, the third wiring W3, and the fourth wiring W4 are disposed on the first insulating layer, and the first bridge wiring BW1 is disposed on a layer different from the first insulating layer. In an exemplary embodiment, as shown in FIG. 3, the first bridge wiring BW1 may be disposed over a 2-1$^{st}$ insulating layer disposed over the inter-insulating layer 130, which is the first insulating layer, for example. The 2-1$^{st}$ insulating layer may include, for example, a first planarization layer 141. That is, the first planarization layer 141 may cover the 1-1$^{st}$ wiring W1-1, the 1-2$^{nd}$ wiring W1-2, the second wiring W2, the third wiring W3, and the fourth wiring W4. The first bridge wiring BW1 may be disposed over the first planarization layer 141. In an exemplary embodiment, the first planarization layer 141 may include, for example, an organic material such as polyimide, acrylic siloxane, carbon black, benzocyclobutene ("BCB"), or hexamethyldisiloxane ("HMDSO"). The first bridge wiring BW1 may include various conductive materials and have a single-layered structure or a multi-layered structure. In an exemplary embodiment, the first bridge wiring BW1 may have a structure of Ti/Al/Ti, for example.

Like this, the first bridge wiring BW1 disposed over the first planarization layer 141, which is the 2-1$^{st}$ insulating layer, contacts the 1-1$^{st}$ wiring W1-1 and the 1-2$^{nd}$ wiring W1-2 through contact holes CTH to electrically connect the 1-1st wiring W1-1 to the 1-2$^{nd}$ wiring W1-2. As shown in FIG. 2, which is a plan view, the first bridge wiring BW1 has a convex shape in the direction (the −x direction) opposite to the direction (the +x direction) from the 1-1$^{st}$ wiring W1-1 and the 1-2$^{nd}$ wiring W1-2 to the second wiring W2. Therefore, a sufficiently wide space may be defined between a central portion of the first bridge wiring BW1 and the second wiring W2.

The first pixel electrode PE1 and the second pixel electrode PE2 are disposed over a 2-2$^{nd}$ insulating layer covering the first bridge wiring BW1. The 2-2nd insulating layer may include, for example, a second planarization layer 142. That is, the second planarization layer 142 may cover the first bridge wiring BW1. The first pixel electrode PE1 and the second pixel electrode PE2 may be disposed over the second planarization layer 142. In an exemplary embodiment, the second planarization layer 142 may include, for example, an organic material such as polyimide, acrylic siloxane, carbon black, BCB, or HMDSO. The first pixel electrode PE1 and the second pixel electrode PE2 may include various conductive materials and have a single-layered structure or a multi-layered structure. In an exemplary embodiment, the first pixel electrode PE1 and the second pixel electrode PE2 may include a reflective layer and a transparent conductive layer, for example. In an exemplary embodiment, the reflective layer may include a metal such as aluminum (Al) or copper (Cu), and the transparent conductive layer may be disposed on the reflective layer and include indium tin oxide ("ITO"), indium zinc oxide ("IZO"), and indium oxide ($In_2O_3$).

The first pixel electrode PE1 disposed over the second planarization layer 142 includes one side (in the +x direction) disposed over the second wiring W2. In addition, another side (the −x direction) of the first pixel electrode PE1 is disposed above a space between the 1-1$^{st}$ end W1-1a and the 1-2$^{nd}$ end W1-2a.

Unlike an inorganic insulating layer including an inorganic material, since the first planarization layer 141 and the second planarization layer 142 include an organic material, top surfaces of the first planarization layer 141 and the second planarization layer 142 are approximately flat despite the presence of elements arranged thereunder. However, even though an organic layer includes an organic material, a top surface thereof is not completely flat and has a slight bending corresponding to elements arranged thereunder.

It is shown in FIG. 3 that a top surface of each of the first planarization layer 141 and the second planarization layer 142 has a slight bending. Since the second planarization layer 142 is disposed on the slightly flat top surface of the first planarization layer 141, a top surface of the second planarization layer 142 is relatively flatter than the top surface of the first planarization layer 141. However, the top surface of the second planarization layer 142 is still affected by the elements below the first planarization layer 141 and thus has a curved shape. Therefore, the top surface of the second planarization layer 142 has a slightly convex shape (in a +z direction) above the second wiring W2. The top surface of the second planarization layer 142 has a slightly convex shape (in the +z direction) above the 1-1$^{st}$ wiring W1-1 and the 1-2$^{nd}$ wiring W1-2. However, the top surface of the second planarization layer 142 has a flat shape between the 1-1$^{st}$ end W1-1a and the 1-2$^{nd}$ end W1-2a. As described above, this is because the first bridge wiring BW1 has the convex shape in the direction (the −x direction) opposite to the direction (the +x direction) from the 1-1$^{st}$ wiring W1-1 and the 1-2$^{nd}$ wiring W1-2 to the second wiring W2.

The first pixel electrode PE1 disposed over the second planarization layer 142 including the top surface of this shape is relatively inclined with respect to the substrate 100 as shown in FIG. 3. That is, a portion of the first pixel electrode PE1 which is disposed above the second wiring W2 and which is one side (in the +x direction) of the first pixel electrode PE1 has a distance farther away from the substrate 100 than another side (in the −x direction) of the first pixel electrode PE1 that is disposed above a space between the 1-1$^{st}$ end W1-1a and the 1-2$^{nd}$ end W1-2a.

As shown in FIGS. 2 and 4, one side (in the +x direction) of the second pixel electrode PE2 is disposed above the third wiring W3, and another side (in the −x direction) of the second pixel electrode PE2 is disposed above a space between the second wiring W2 and the third wiring W3. The top surface of the second planarization layer 142 has a slightly convex shape (in the +z direction) above the third wiring W3. However, the top surface of the second planarization layer 142 has an approximately flat shape between the second wiring W2 and the third wiring W3, more specifically, between the fourth wiring W4 disposed between the second wiring W2 and the third wiring W3 and the third wiring W3. As shown in FIG. 4, the second pixel electrode PE2 disposed over the second planarization layer 142 having this shape is relatively inclined with respect to the substrate 100. That is, a portion of the second pixel electrode PE2 which is disposed above the third wiring W3 and which is one side (in the +x direction) of the second pixel electrode PE2 has a distance farther away from the substrate 100 than another side (in the −x direction) of the second pixel electrode PE2 that is disposed above a space between the second wiring W2 and the third wiring W3.

Figure 5:
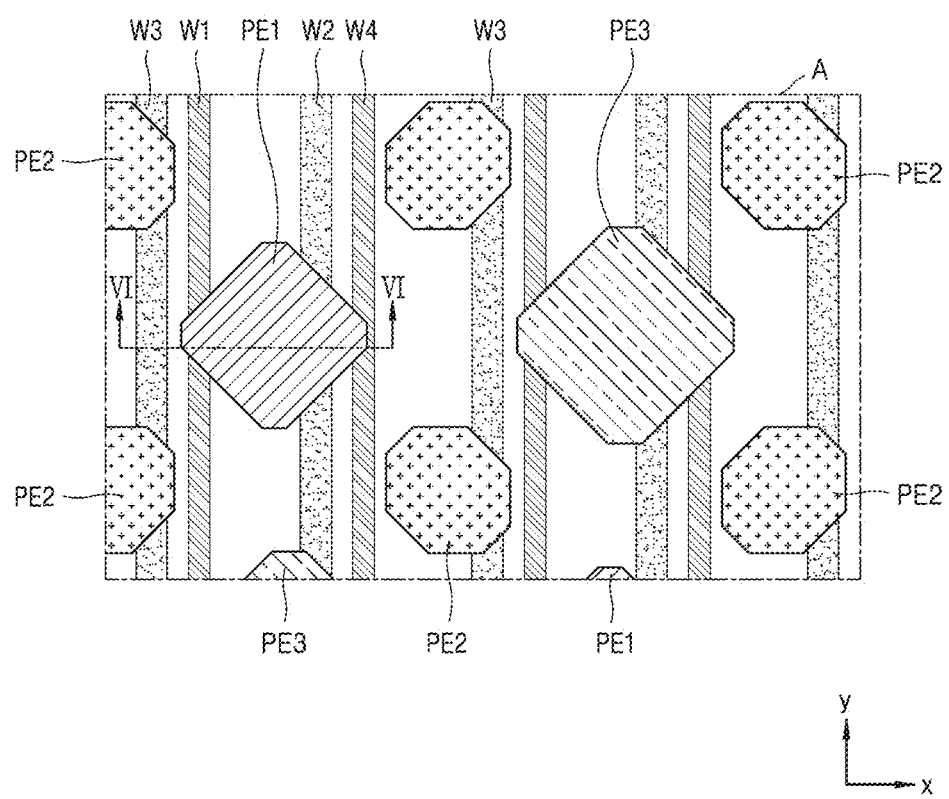
FIG. 5 is a plan view of a comparative example of a portion of a display device
Figure 6:
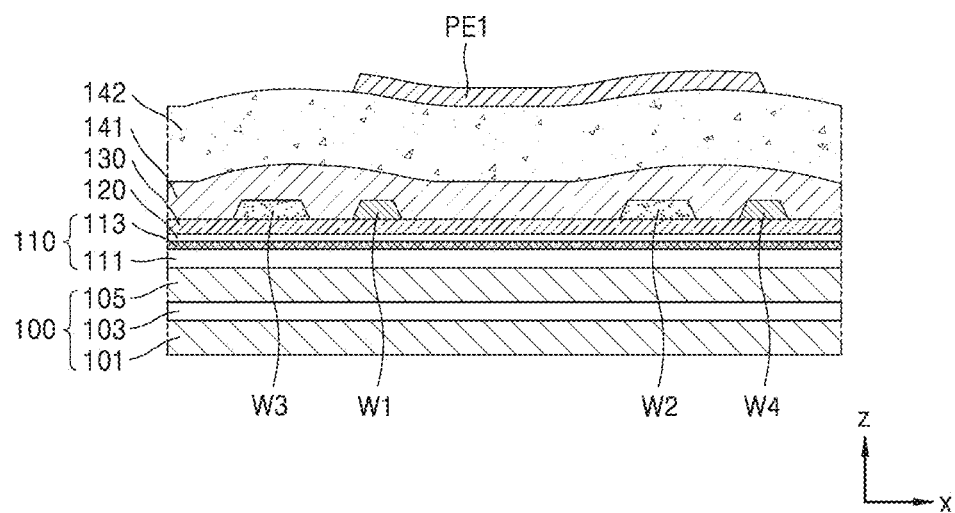
FIG. 6 is a cross-sectional view taken along line VI-VI of FIG. 5.

FIG. 5 is a plan view of a comparative example of a portion of a display device, and FIG. 6 is a cross-sectional view of the display device taken along line VI-VI of FIG. 5. In the display device according to a comparative art, the first wiring W1 has a shape extending in the first direction (the −y direction) without disconnection instead of having the 1-1$^{st}$ end W1-1a and the 1-2$^{nd}$ end W1-2a apart from each other. Therefore, as shown in FIG. 4, the top surface of the second planarization layer 142 has a convex shape (in the +z direction) in portions respectively corresponding to the first wiring W1 and the second wiring W2. In addition, one side (in the +x direction) of the first pixel electrode PE1 that is disposed over the second planarization layer 142 is approximately disposed above the second wiring W2, and another side (in the −x direction) of the first pixel electrode PE1 is approximately disposed above the first wiring W1.

Therefore, unlike the first pixel electrode PE1 of the display device 1 in the illustrated exemplary embodiment described with reference to FIG. 3, a comparative example of the first pixel electrode PE1 of the display device is not inclined to one side with respect to the substrate 100, and as shown in FIG. 6, has an approximately flat shape, that is, a shape in which both an edge of the first pixel electrode PE1 in the +x direction and an edge of the first pixel electrode PE1 in the −x direction are convex in the +z direction. However, like the second pixel electrode PE2 of the illustrated exemplary embodiment of the display device 1 described with reference to FIG. 4, the second electrode PE2 of the comparative example of the display device is relatively inclined with respect to the substrate 100. This is because a portion of the second pixel electrode PE2 which is one side (in the +x direction) of the second pixel electrode PE2 and which is disposed above the third wiring W3 has a distance farther away from the substrate 100 than another side (in the −x direction) of the second pixel electrode PE2 that is disposed above a space between the second wiring W2 and the third wiring W3.

In the display device, to reduce external light reflection, a color filter is arranged over each pixel. In the case of a pixel emitting red light, a red color filter transmitting only red light is arranged, for example. In the case of a pixel emitting blue light, a blue color filter transmitting only blue light is arranged, for example. In the case of a pixel emitting green light, a green color filter transmitting only green light is arranged, for example. Therefore, when external light, which is white light, is incident to, for example, a red color filter, blue light and green light are absorbed in the red color filter and only red light passes through the red color filter and then is reflected by a pixel electrode, passes through the red color filter again, and is emitted to the outside. Therefore, in the case of the display device including the color filter, external light reflection is reduced to one-third (⅓) compared to the display device including no color filter.

However, in the comparative example of the display device shown in FIGS. 5 and 6, a user may view a color band by external light reflection. That is, as shown in FIG. 6, light reflected by the first pixel electrode PE1 having an approximately flat shape with respect to the substrate 100 progresses in the +z direction approximately perpendicular to the substrate 100. In contrast, as shown in FIG. 4, light reflected by the second pixel electrode PE2 having a shape inclined with respect to the substrate 100 progresses at a particular angle that is not perpendicular to the substrate 100. Therefore, in the case where the second pixel electrode PE2 is a pixel electrode of a pixel emitting green light, a user views, as reflected light, light that is close to purple light in which red light and blue light are mixed in a direction perpendicular to the substrate 100, and views, as reflected light, light that is close to green light at a particular angle that is not perpendicular to the substrate 100. Therefore, in the comparative example of the display device, a user views a color band by external light reflection.

In contrast, in the illustrated exemplary embodiment of the display device 1, not only the second pixel electrode PE2 but also the first pixel electrode PE1 is inclined with respect to the substrate 100. Therefore, a user may not view a color band by external light reflection or the degree of the color band may be minimized even though the color band may be viewed by the user.

Similarly to the second pixel electrode PE2, to keep the first pixel electrode PE1 inclined with respect to the substrate 100, the top surface of the second planarization layer 142 is made to have an approximately flat shape between the 1-$1^{st}$ end W1-1a and the 1-$2^{nd}$ end W1-2a by making the 1-$1^{st}$ end W1-1a apart from the 1-$2^{nd}$ end W1-2a. For this purpose, the first bridge wiring BW1 electrically connecting the 1-$1^{st}$ end W1-1a to the 1-$2^{nd}$ end W1-2a should not pass below the first pixel electrode PE1. Therefore, it is desired that an orthogonal projection image of the first pixel electrode PE1 onto the substrate 100 does not overlap an orthogonal projection image of the first bridge wiring BW1 onto the substrate 100. In the case of the second pixel electrode PE2, an orthogonal projection image of the second pixel electrode PE2 onto the substrate 100 does not overlap an orthogonal projection image of the second wiring W2 onto the substrate 100.

For reference, as shown in FIG. 2, the arrangement relationship between the third pixel electrode PE3 and wirings therearound is similar to the arrangement relationship between the first pixel electrode PE1 and wirings therearound. That is, one side (in the +x direction) of the third pixel electrode PE3 is disposed above the second wiring W2. Also, another side (in the −x direction) of the third pixel electrode PE3 is disposed above a space between the 1-$1^{st}$ end W1-1a and the 1-$2^{nd}$ end W1-2a. Therefore, the third pixel electrode PE3 is inclined similar to the first pixel electrode PE1 arranged in FIG. 3.

It is shown in FIG. 2 that an area of one first pixel electrode PE1, an area of one second pixel electrode PE2, and an area of one third pixel electrode PE3 are different from one another. This is because light-emission efficiency may be different for each pixel. In addition, it is shown in FIG. 2 that the number of second pixel electrodes PE2 per unit area is greater than the number of first pixel electrodes PE1 per unit area and the number of third pixel electrodes PE3 per unit area. Therefore, an area of one second pixel electrode PE2 may be less than an area of one first pixel electrode PE1 and an area of one third pixel electrode PE3. The same is applied to exemplary embodiments below and modifications thereof.

A pixel-defining layer (not shown) may be arranged on the second planarization layer 142. The pixel-defining layer defines a pixel by defining an opening corresponding to each sub-pixel, that is, an opening exposing at least a central portion of each of the first pixel electrode PE1 to the third pixel electrode PE3. The pixel-defining layer may include an organic material such as polyimide or HMDSO.

In the case where the display device includes an organic light-emitting diode as a display element, an intermediate layer (not shown) may be disposed over the first pixel electrode PE1 to the third pixel electrode PE3. An opposite electrode (not shown) may be disposed over the intermediate layer.

The intermediate layer may include a low molecular weight material or a polymer material. In the case where the intermediate layer includes a low molecular weight material, the intermediate layer may have a structure in which a hole injection layer ("HIL"), a hole transport layer ("HTL"), an emission layer ("EML"), an electron transport layer ("ETL"), an electron injection layer ("EIL"), etc., are stacked. In an exemplary embodiment, the intermediate layer may include various organic materials such as copper phthalocyanine (CuPc), N, N'-Di (naphthalene-1-yl)-N, N'-diphenyl-benzidine ("NPB"), and tris-8-hydroxyquinoline aluminum (Alq3). These layers may be provided by vacuum deposition.

In the case where the intermediate layer includes a polymer material, the intermediate layer may have a structure generally including an HTL and an EML. In this case, the HTL may include poly-3, 4-ethylene dioxy thiophene ("PEDOT"), and the EML may include a polymer material such as a polyphenylene vinylene ("PPV")-based material and a polyfluorene-based material. In an exemplary embodiment, the intermediate layer may be provided by screen printing, an inkjet printing method, and laser induced thermal imaging ("LITI"), for example.

The structure of the intermediate layer is not limited to the above description and may have various structures. In addition, the intermediate layer may include a single unitary body which covers the first pixel electrode PE1 to the third pixel electrode PE3, or include a layer patterned to correspond to each of the first pixel electrode PE1 to the third pixel electrode PE3.

The opposite electrode may be arranged to cover the display area DA. That is, the opposite electrode may be provided as a single unitary body over a plurality of organic light-emitting diodes to correspond to the first pixel electrode PE1 to the third pixel electrode PE3. In an exemplary embodiment, the opposite electrode may include a transparent conductive layer including ITO, IZO, or $In_2O_3$, for example.

Though it is shown in FIG. 2 that the first bridge wiring BW1 partially overlaps the third wiring W3 therebelow, the invention is not limited thereto. In an exemplary embodiment, the first bridge wiring BW1 may not overlap the third wiring W3 by securing an interval between the third wiring W3 and the 1-$1^{st}$ wiring W1-1, for example. This is applicable to the relationship between various bridge wirings and wirings therebelow in exemplary embodiments below and modifications thereof.

Figure 7:
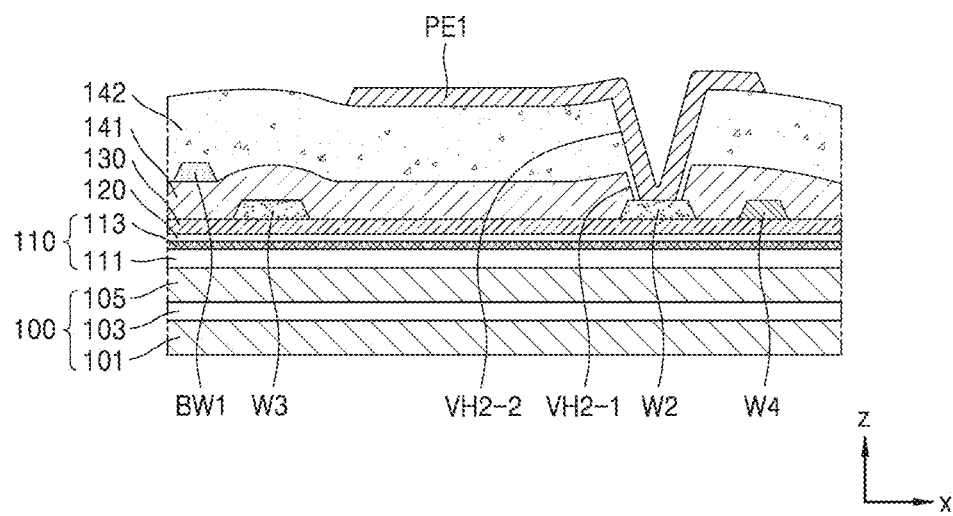
FIGS. 7 and 8 are cross-sectional views of another exemplary embodiment of portions of a display device.
Figure 8:
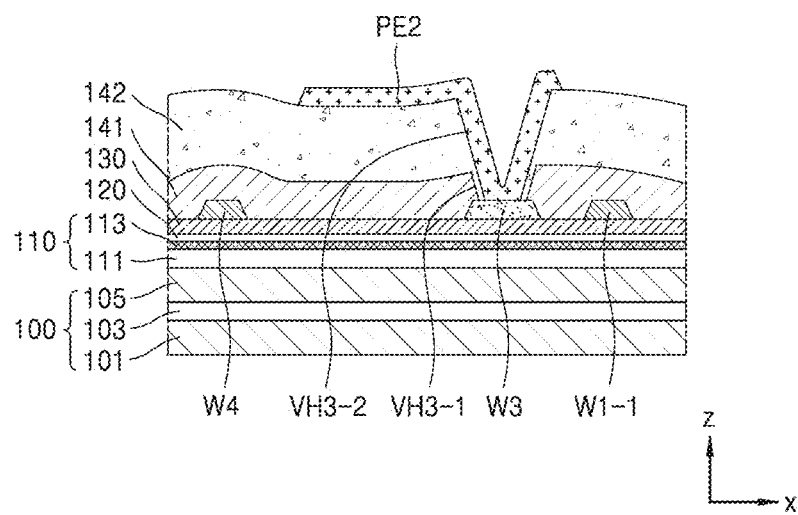

FIGS. 7 and 8 are cross-sectional views of another exemplary embodiment of portions of the display device 1. As shown in the drawings, the first pixel electrode PE1 may be electrically connected to the second wiring W2, and the second pixel electrode PE2 may be electrically connected to the third wiring W3. In this case, the second wiring W2 and the third wiring W3 may not be the power lines as in the above exemplary embodiment and may be a wiring connected to one of a source electrode and a drain electrode of a TFT. In an alternative exemplary embodiment, the second wiring W2 and the third wiring W3 may be one of the source electrode and the drain electrode of the TFT. In this case, the TFT may be a driving TFT or an emission control TFT.

That is, in an organic light-emitting display device, a pixel circuit may be arranged to each pixel to control an operation of each pixel, and the pixel circuit may include a plurality of TFTs and a capacitor. The pixel circuit may be electrically connected to a corresponding pixel electrode. In this case, the second wiring W2 and the third wiring W3 may not be the power lines as in the above exemplary embodiment and may be an electronic element such as a TFT electrically connected to the first pixel electrode PE1 and the second pixel electrode PE2, or wirings connected to the electronic element.

In this case, as shown in FIGS. 7 and 8, a 2-$1^{st}$ via hole VH2-1 and a 3-$1^{st}$ via hole VH3-1 may be defined in the first planarization layer 141, which is the 2-$1^{st}$ insulating layer. The 2-$1^{st}$ via hole VH2-1 is over the second wiring W2, and the 3-$1^{st}$ via hole VH3-1 is over the third wiring W3. In addition, a 2-$2^{nd}$ via hole VH2-2 and a 3-$2^{nd}$ via hole VH3-2 may be defined in the second planarization layer 142, which is the 2-$2^{nd}$ insulating layer on the 2-$1^{st}$ insulating layer. The 2-$2^{nd}$ via hole VH2-2 may correspond to the 2-$1^{st}$ via hole VH2-1, and the 3-$2^{nd}$ via hole VH3-2 may correspond to the 3-$1^{st}$ via hole VH3-1. Therefore, the first pixel electrode PE1 may contact the second wiring W2 through the 2-$1^{st}$ via hole VH2-1 and the 2-$2^{nd}$ via hole VH2-2, and the second pixel electrode PE2 may contact the third wiring W3 through the 3-$1^{st}$ via hole VH3-1 and the 3-$2^{nd}$ via hole VH3-2.

Though it is shown in FIG. 7 that the second planarization layer 142 covers an inner surface of the 2-$1^{st}$ via hole VH2-1, the invention is not limited thereto. In an exemplary embodiment, since the 2-$2^{nd}$ via hole VH2-2 exposes an inner surface of the 2-$1^{st}$ via hole VH2-1, the inner surface of the 2-$1^{st}$ via hole VH2-1 may directly contact the first pixel electrode PE1, for example. Though it is shown in FIG. 8 that the second planarization layer 142 covers an inner surface of the 3-$1^{st}$ via hole VH3-1, the invention is not limited thereto. In an exemplary embodiment, since the 3-$2^{nd}$ via hole VH3-2 exposes an inner surface of the 3-$1^{st}$ via hole VH3-1, the inner surface of the 3-$1^{st}$ via hole VH3-1 may directly contact the second pixel electrode PE2, for example.

During a manufacturing process, a material of the first planarization layer 141 and the second planarization layer 142 may have a characteristic such as a photoresist. Therefore, a material for the first planarization layer 141 is disposed on the inter-insulating layer 130 by a method such as slit coating, and the 2-$1^{st}$ via hole VH2-1 and the 3-$1^{st}$ via hole VH3-1 are defined through an exposing and developing. In an exemplary embodiment, curing may be performed for about 60 minutes at 250 degrees Celsius, for example. Then, a material for the second planarization layer 142 is provided to cover the first planarization layer 141 by a method such as slit coating, and the 2-$2^{nd}$ via hole VH2-2 and the 3-$2^{nd}$ via hole VH3-2 are defined through an exposing and developing. In addition, curing may be performed for about 60 minutes at 250 degrees Celsius. Before the second planarization layer 142 is provided after the first planarization layer 141 is provided, the first bridge wiring BW1, etc., may be provided by a deposition method that uses a fine metal mask.

Figure 9:
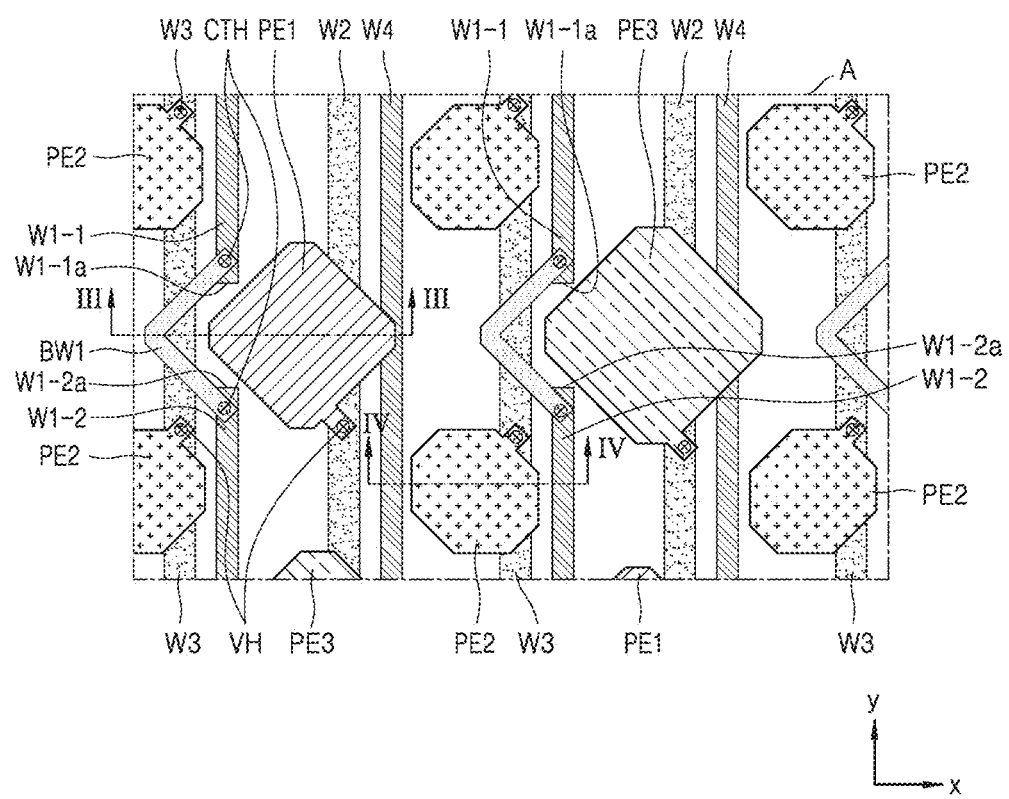
FIG. 9 is a plan view of a portion of another exemplary embodiment of a display device.

As shown in FIGS. 7 and 8, when the first pixel electrode PE1 contacts the second wiring W2 corresponding thereto through the 2-$1^{st}$ via hole VH2-1 and the 2-$2^{nd}$ via hole VH2-2, and the second pixel electrode PE2 contacts the third wiring W3 corresponding thereto through the 3-$1^{st}$ via hole VH3-1 and the 3-$2^{nd}$ via hole VH3-2, the locations of the via holes may correspond to outer edges, not emission areas of the pixel electrodes. Furthermore, as shown in FIG. 9, which is a plan view of another exemplary embodiment of a portion of the display device 1, the first pixel electrode PE1 may include protrusions protruding in the +x direction and the −y direction and contact the second wiring W2 corresponding thereto through the 2-$1^{st}$ via hole VH2-1 and the 2-$2^{nd}$ via hole VH2-2 defined in the places where the protrusions are disposed. In addition, the second pixel electrode PE2 may include protrusions protruding in the +x direction and the +y direction and contact the third wiring W3 corresponding thereto through the 3-$1^{st}$ via hole VH3-1 and the 3-$2^{nd}$ via hole VH3-2 defined in the places where the protrusions are disposed. Like the first pixel electrode PE1, the third pixel electrode PE3 may include protrusions protruding in the +x direction and the −y direction and contact the second wiring W2 corresponding thereto through the via holes defined in the places where the protrusions are disposed. For reference, in FIG. 9, all via holes are represented by a reference character VH, for convenience of description.

Figure 10:
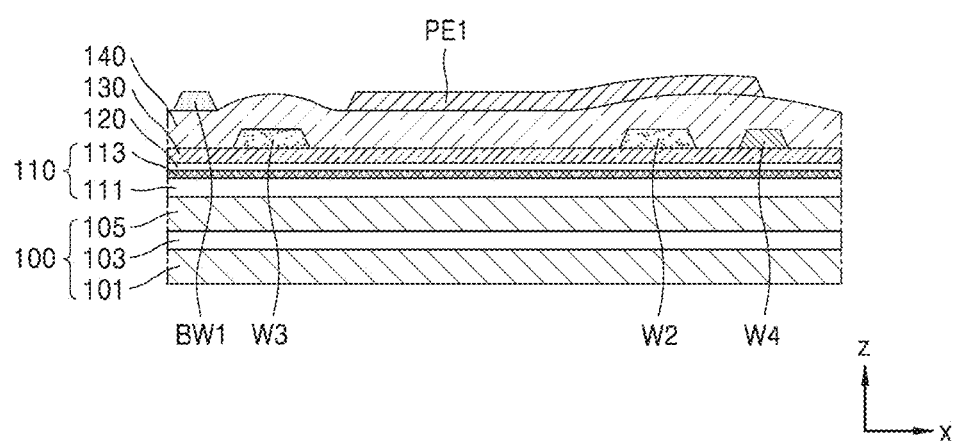
FIGS. 10 and 11 are cross-sectional views of another exemplary embodiment of portions of a display device.
Figure 11:
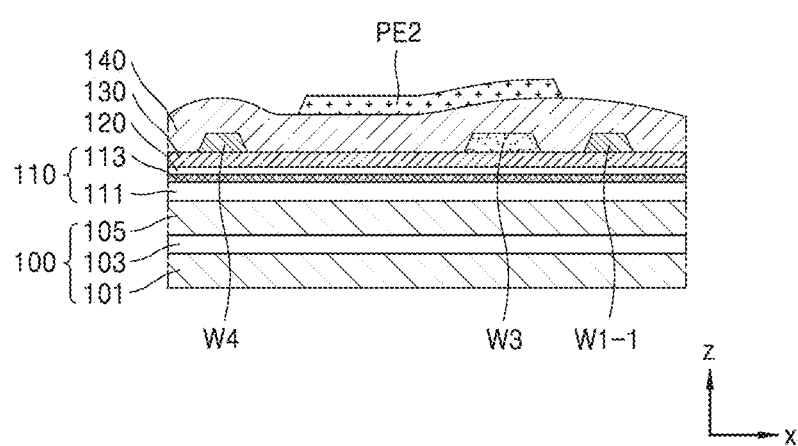

Though it is described that the first bridge wiring BW1 is disposed between the first planarization layer 141 and the second planarization layer 142 and that the first pixel electrode PE1 to the third pixel electrode PE3 are disposed over the second planarization layer 142 in the exemplary embodiments above, the invention is not limited thereto. In another exemplary embodiment, as shown in FIGS. 10 and 11, which are cross-sectional views of a portion of the display device 1, a planarization layer 140, which is a second insulating layer, may cover the $1$-$1^{st}$ wiring W1-1, the $1$-$2^{nd}$ wiring W1-2, the second wiring W2, and the third wiring W3. The first bridge wiring BW1, the first pixel electrode PE1, the second pixel electrode PE2 may be disposed over the second insulating layer not to contact one another, for example.

The first bridge wiring BW1 has a convex shape in the direction (the −x direction) opposite to the direction (the +x direction) from the $1$-$1^{st}$ wiring W1-1 and the $1$-$2^{nd}$ wiring W1-2 to the second wiring W2. Therefore, a sufficiently wide space may be defined between the central portion of the first bridge wiring BW1 and the second wiring W2, and a portion of the first pixel electrode PE1 may be disposed in the space. Therefore, the first bridge wiring BW1 and the first pixel electrode PE1 may be disposed over the same layer. In this case, the first bridge wiring BW1 may include the same material as that of the first pixel electrode PE1 and be simultaneously provided while the first pixel electrode PE1 is provided. Therefore, the first bridge wiring BW1 may include the same material as that of the first pixel electrode PE1 and have the same layered structure as that of the first pixel electrode PE1.

Even in this case, as shown in FIGS. 10 and 11, the first pixel electrode PE1 is relatively inclined with respect to the substrate 100, and similarly, the second pixel electrode PE2 is relatively inclined with respect to the substrate 100. Therefore, a color band by external light reflection may not occur or be minimized.

Since the first bridge wiring BW1 electrically connecting the $1$-$1^{st}$ wiring W1-1 to the $1$-$2^{nd}$ wiring W1-2 does not contact the first pixel electrode PE1 while disposed over the same layer as the first pixel electrode PE1, an orthogonal projection image of the first pixel electrode PE1 onto the substrate 100 does not overlap an orthogonal projection image of the first bridge wiring BW1 onto the substrate 100. In addition, an orthogonal projection image of the second pixel electrode PE2 onto the substrate 100 does not overlap an orthogonal projection image of the second wiring W2 onto the substrate 100.

Figure 12:
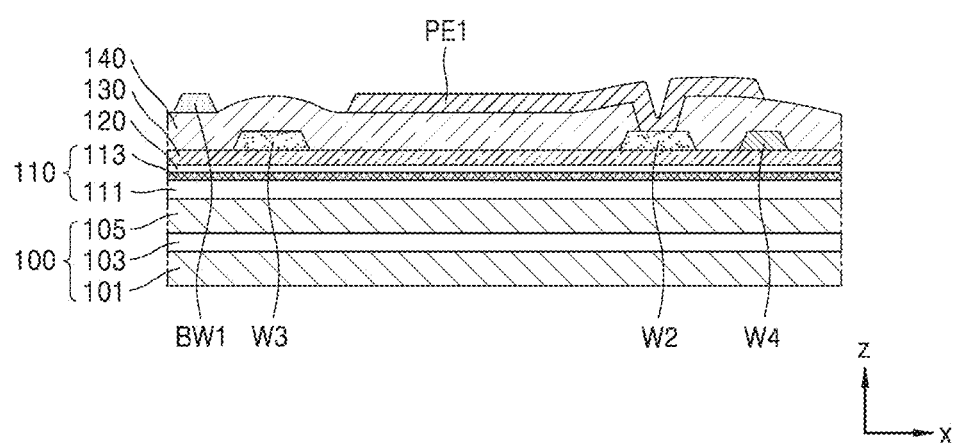
FIGS. 12 and 13 are cross-sectional views of another exemplary embodiment of portions of a display device.
Figure 13:
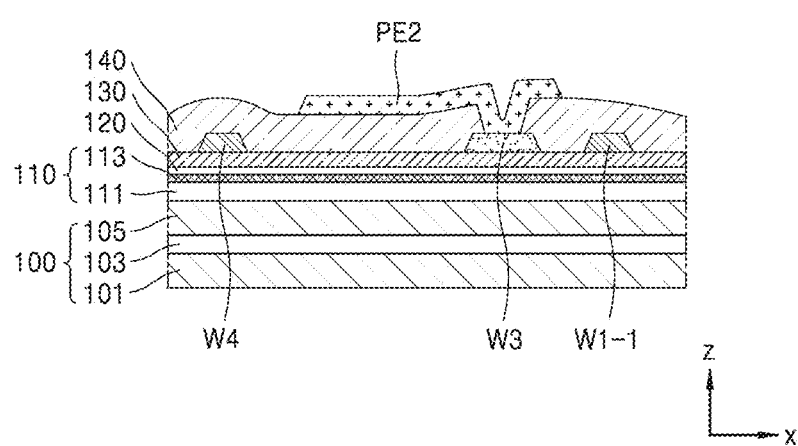

Even in this case, as shown in FIGS. 12 and 13, which are cross-sectional views of another exemplary embodiment of portions of the display device 1, a second via hole and a third via hole may be defined in the planarization layer 140, which is the second insulating layer. The second via hole may be defined over the second wiring W2 and the third via hole may be defined over the third wiring W3. The first pixel electrode PE1 may contact the second wiring W2 through the second via hole and the second pixel electrode PE2 may contact the third wiring W3 through the third via hole.

Figure 14:
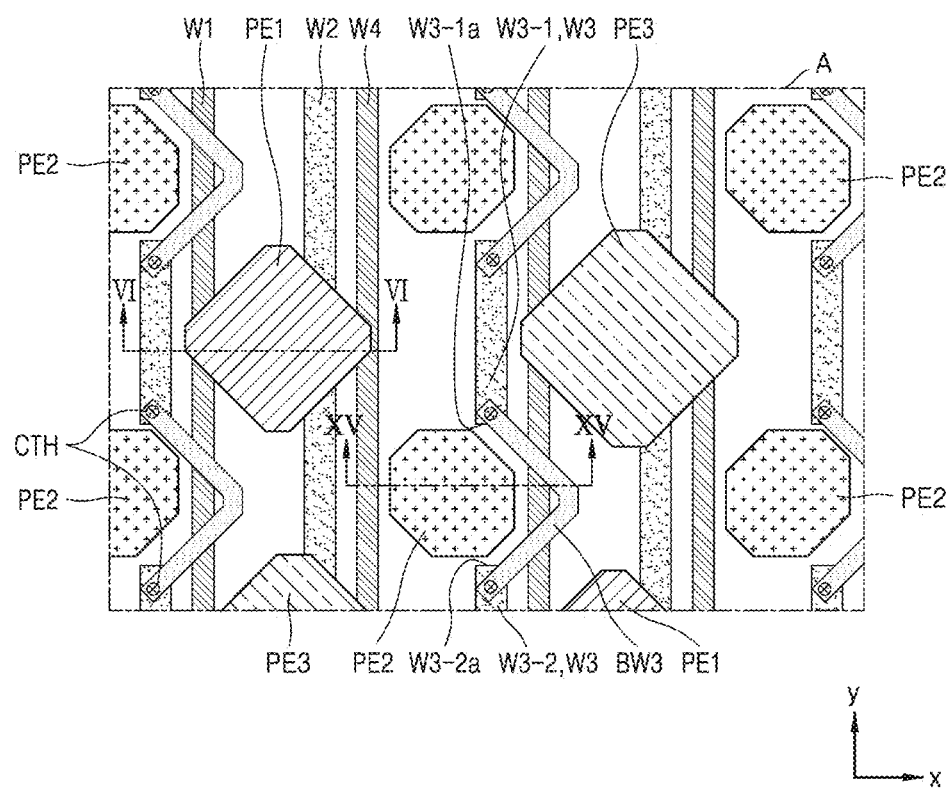
FIG. 14 is a plan view of a portion of another exemplary embodiment of a display device.
Figure 15:
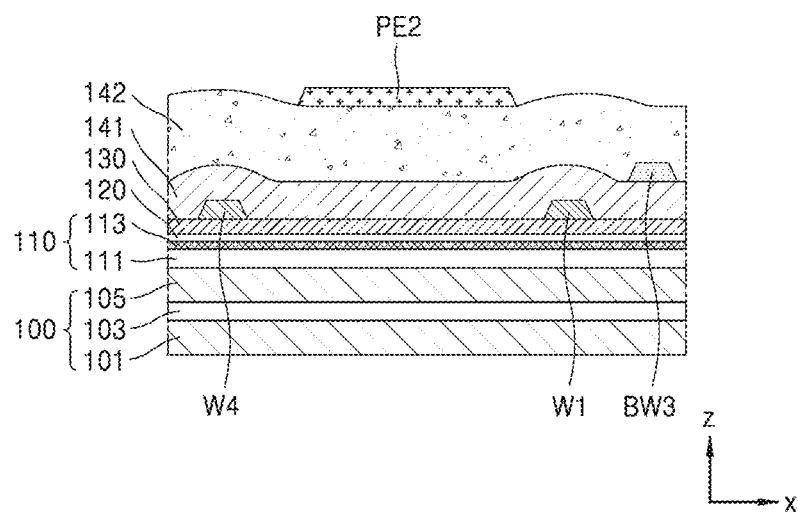
FIG. 15 is a cross-sectional view taken along line XV-XV of FIG. 14.

FIG. 14 is a plan view of another exemplary embodiment of a portion of the display device 1, and FIG. 15 is a cross-sectional view of the display device 1 taken along line XV-XV of FIG. 14. Though description has been made to the display device having a structure in which the first pixel electrode PE1 to the third pixel electrode PE3 are similarly inclined with respect to the substrate 100 in the exemplary embodiments above, an illustrated exemplary embodiment of a display device in which the first pixel electrode PE1 to the third pixel electrode PE3 are approximately flat with respect to the substrate 100 is described.

The display device in the illustrated exemplary embodiment is different from the display device according to the exemplary embodiment above in that the first wiring W1 arranged on the inter-insulating layer 130, which is the first insulating layer, extends in the first direction (the −y direction) and does not have the first end W1-1$a$ or the second end W1-2$a$. Like the exemplary embodiment above, the second wiring W2 is disposed over the inter-insulating layer 130, which is the first insulating layer, extends in the first direction (the −y direction) to correspond to the first wiring W1 and is apart in the +x direction from the first wiring W1. Therefore, a cross-section taken along line VI-VI of FIG. 14 has a shape shown in FIG. 6, which is a cross-sectional view of a comparative example of the display device taken along line VI-VI.

That is, in the illustrated exemplary embodiment of the display device, a top surface of the second planarization layer 142 has a convex shape (in the +z direction) in portions thereof corresponding to the first wiring W1 and the second wiring W2. In addition, one side (in the +x direction) of the first pixel electrode PE1 that is disposed over the second planarization layer 142 is approximately disposed above the second wiring W2, and another side (in the −x direction) of the first pixel electrode PE1 is approximately disposed above the first wiring W1. Therefore, the first pixel electrode PE1 of the display device in the illustrated exemplary embodiment has an approximately flat shape with respect to the substrate 100 as shown in FIG. 6.

Unlike the exemplary embodiments of the display device described above, in the illustrated exemplary embodiment of the display device, the third wiring W3 which is disposed over the inter-insulating layer 130 such that the second wiring W2 is between the first wiring W1 and the third wiring W3 includes the $3$-$1^{st}$ wiring W3-1 and the $3$-$2^{nd}$ wiring W3-2. The $3$-$1^{st}$ wiring W3-1 extends in the first direction (the −y direction) and includes a $3$-$1^{st}$ end W3-1$a$ at an end portion thereof in the first direction (the −y direction). The $3$-$2^{nd}$ wiring W3-2 faces the $3$-$1^{st}$ end W3-1$a$ by extending in the direction (the +y direction) opposite to the first direction (the −y direction) and includes a $3$-$2^{nd}$ end W3-2$a$ apart from the $3$-$1^{st}$ end W3-1$a$.

A third bridge wiring BW3 is disposed on a layer different from a layer on which the first wiring W1, the second wiring W2, the $3$-$1^{st}$ wiring W3-1, the $3$-$2^{nd}$ wiring W3-2, and the fourth wiring W4 are disposed. That is, the first wiring W1, the second wiring W2, the $3$-$1^{st}$ wiring W3-1, the $3$-$2^{nd}$ wiring W3-2, and the fourth wiring W4 are disposed over the first insulating layer, and the third bridge wiring BW3 is disposed over a layer different from the first insulating layer. In an exemplary embodiment, as shown in FIG. 15, the third bridge wiring BW3 may be disposed over the $2$-$1^{st}$ insulating layer on the inter-insulating layer 130, which is the first insulating layer, for example. The $2$-$1^{st}$ insulating layer may include, for example, the first planarization layer 141. That is, the first planarization layer 141 may cover the first wiring W1, the second wiring W2, the $3$-$1^{st}$ wiring W3-1, the $3$-$2^{nd}$ wiring W3-2, and the fourth wiring W4. The third bridge wiring BW3 may be disposed over the first planarization layer 141. The material of the first planarization layer 141 is the same as described above. The third bridge wiring BW3 may include various conductive materials and include a single-layered structure or a multi-layered structure. In an exemplary embodiment, the third bridge wiring BW3 may have a structure of Ti/Al/Ti, for example.

As described above, the third bridge wiring BW3 on the first planarization layer 141, which is the 2-1$^{st}$ insulating layer, contacts the 3-1$^{st}$ wiring W3-1 and the 3-2$^{nd}$ wiring W3-2 through contact holes CTH to electrically connect the 3-1$^{st}$ wiring W3-1 to the 3-2$^{nd}$ wiring W3-2. In addition, as shown in FIG. 14, which is a plan view, the third bridge wiring BW3 has a convex shape in the direction (the +x direction) opposite to the direction (the −x direction) from the 3-1$^{st}$ wiring W3-1 and the 3-2nd wiring W3-2 to the second wiring W2. Therefore, a sufficiently wide space may be defined between the central portion of the third bridge wiring BW3 and the second wiring W2. The second pixel electrode PE2 is disposed above the space secured in this manner. That is, one side of the second pixel electrode PE2 is disposed above a space (in the +z direction) between the 3-1$^{st}$ end W3-1a and the 3-2$^{nd}$ end W3-2a, and another side of the second pixel electrode PE2 is disposed above a space between a center of a space between the 3-1$^{st}$ end W3-1a and the 3-2$^{nd}$ end W3-2a, and the second wiring W2. As a result, since the second wiring W2, the fourth wiring W4, and the third wiring W3 do not pass below the second pixel electrode PE2, the second pixel electrode PE2 is not inclined with respect to the substrate 100 as shown in FIG. 15.

As described above, in the illustrated exemplary embodiment of the display device, the first pixel electrode PE1 and the second pixel electrode PE2 are not inclined with respect to the substrate 100 as shown in FIGS. 6 and 15. Therefore, a user may not view a color band by external light reflection or the degree of the color band may be minimized even when the color band is viewed by the user.

To allow the second pixel electrode PE2 not to be inclined with respect to the substrate 100, a top surface of the second planarization layer 142 is made to have an approximately flat shape between the 3-1$^{st}$ end W3-1a and the 3-2$^{nd}$ end W3-2a by making the 3-1$^{st}$ end W3-1a apart from the 3-2$^{nd}$ end W3-2a. For this purpose, the third bridge wiring BW3 should not pass below the second pixel electrode PE2, the third bridge wiring BW3 electrically connecting the 3-1$^{st}$ wiring W3-1 to the 3-2$^{nd}$ wiring W3-2. Therefore, it is desired that an orthogonal projection image of the second pixel electrode PE2 onto the substrate 100 does not overlap an orthogonal projection image of the third bridge wiring BW3 onto the substrate 100.

For reference, as shown in FIG. 14, the arrangement relationship between the third pixel electrode PE3 and the wirings therearound is similar to the arrangement relationship between the first pixel electrode PE1 and the wirings therearound. That is, one side (in the +x direction) of the third pixel electrode PE3 is disposed above the second wiring W2. In addition, another side (in the −x direction) of the third pixel electrode PE3 is disposed above the first wiring W1. Therefore, similarly to the first pixel electrode PE1 shown in FIG. 6, the third pixel electrode PE3 is not inclined with respect to the substrate 100.

As described above, the third bridge wiring BW3 has a convex shape in the direction (the +x direction) opposite to the direction (the −x direction) from the 3-1$^{st}$ wiring W3-1 and the 3-2$^{nd}$ wiring W3-2 to the second wiring W2. Therefore, it is preferable that a virtual line connecting the 3-1$^{st}$ wiring W3-1 to the 3-2$^{nd}$ wiring W3-2 passes below the one side of the second pixel electrode PE2. The one side of the second pixel electrode PE2 is a part of the second pixel electrode PE2 in the direction (the +x direction) opposite to the direction (the −x direction) to the second wiring W2.

Through this configuration, a total length of the third bridge wiring BW3 may be minimized.

In the illustrated exemplary embodiment of the display device, the first wiring W1 may include, for example, the data line, and the second wiring W2 may include, for example, the power line. That is, the first wiring W1 may include a data line which transfers a data signal to a pixel in which the first pixel electrode PE1 is disposed, and the second wiring W2 may include a power line which supplies power to a pixel in which the first pixel electrode PE1 is disposed. The fourth wiring W4 disposed between the second wiring W2 and the third wiring W3 may include, for example, a data line, and the third wiring W3 may include, for example, the power line. That is, the fourth wiring W4 may include a data line which transfers a data signal to a pixel in which the second pixel electrode PE2 is disposed, and the third wiring W3 may include a power line which supplies power to a pixel in which the second pixel electrode PE2 is disposed.

However, the invention is not limited thereto. In an exemplary embodiment, the first pixel electrode PE1 may be electrically connected to one of the first wiring W1 and the second wiring W2, and the second pixel electrode PE2 may be electrically connected to the third bridge wiring BW3, for example. In this case, the wiring to which the first pixel electrode PE1 is electrically connected may not be a data line or a power line and may be a wiring connected to one of a source electrode and a drain electrode of a TFT. In an alternative exemplary embodiment, the wiring to which the first pixel electrode PE1 is electrically connected may be one of the source electrode and the drain electrode of the TFT. In this case, the TFT may include a driving TFT or an emission control TFT. The 3-1$^{st}$ wiring W3-1 and the 3-2$^{nd}$ wiring W3-2 electrically connected to the third bridge wiring BW3 may not be a data line or a power line and may be a wiring connected to one of a source electrode and a drain electrode of a TFT. In an alternative exemplary embodiment, the wiring electrically connected to the third bridge wiring BW3 may be one of the source electrode and the drain electrode of the TFT.

In this case, the 2-1$^{st}$ via hole defined over the second wiring W2 may be defined in the first planarization layer 141, which is the 2-1$^{st}$ insulating layer. In addition, the 2-2$^{nd}$ via hole and the third via hole may be defined in the second planarization layer 142, which is the 2-2$^{nd}$ insulating layer on the 2-1$^{st}$ insulating layer. The 2-2$^{nd}$ via hole corresponds to the 2-1$^{st}$ via hole, and the third via hole is over the third bridge wiring BW3. Therefore, the first pixel electrode PE1 may contact the second wiring W2 through the 2-1$^{st}$ via hole and the 2-2$^{nd}$ via hole, and the second pixel electrode PE2 may contact the third bridge wiring BW3 through the third via hole.

Figure 16:
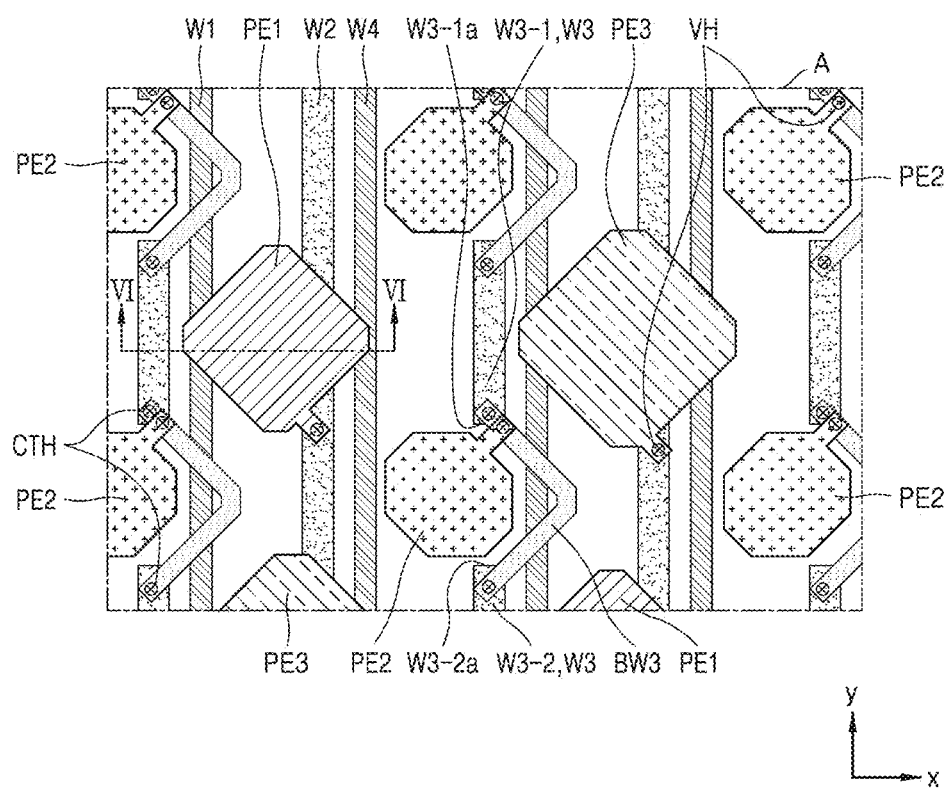
FIG. 16 is a plan view of another exemplary embodiment of a portion of a display device.

When the first pixel electrode PE1 contacts the second wiring W2 through the 2-1$^{st}$ via hole and the 2-2$^{nd}$ via hole, and the second pixel electrode PE2 is electrically connected to the third wiring W3 through the third bridge wiring BW3 through the third via hole, the locations of the via holes may correspond to outer edges, not emission areas of the pixel electrodes. Furthermore, as shown in FIG. 16, which is a plan view of another exemplary embodiment of a portion of the display device 1, the first pixel electrode PE1 may include protrusions protruding in the +x direction and the −y direction and contact the second wiring W2 corresponding thereto through the 2-1$^{st}$ via hole and the 2-2$^{nd}$ via hole defined in places where the protrusions are disposed. In addition, the second pixel electrode PE2 may include protrusions protruding in the +x direction and the +y direction and contact the third wiring W3 corresponding thereto through the third bridge wiring BW3 through the third via holes defined in places where the protrusions are disposed. Like the first pixel electrode PE1, the third pixel electrode PE3 includes protrusions protruding in the +x direction and the −y direction and contacts the second wiring W2 corresponding thereto through via holes defined in places where the protrusions are disposed. For reference, in FIG. 16, all via holes are represented by a reference character VH, for convenience of description.

In FIGS. 14 to 16, description has been made to the case where the first pixel electrode PE1 and the second pixel electrode PE2 are approximately parallel to the substrate 100 by the third bridge wiring BW3 near the second pixel electrode PE2. However, the invention is not limited thereto.

Figure 17:
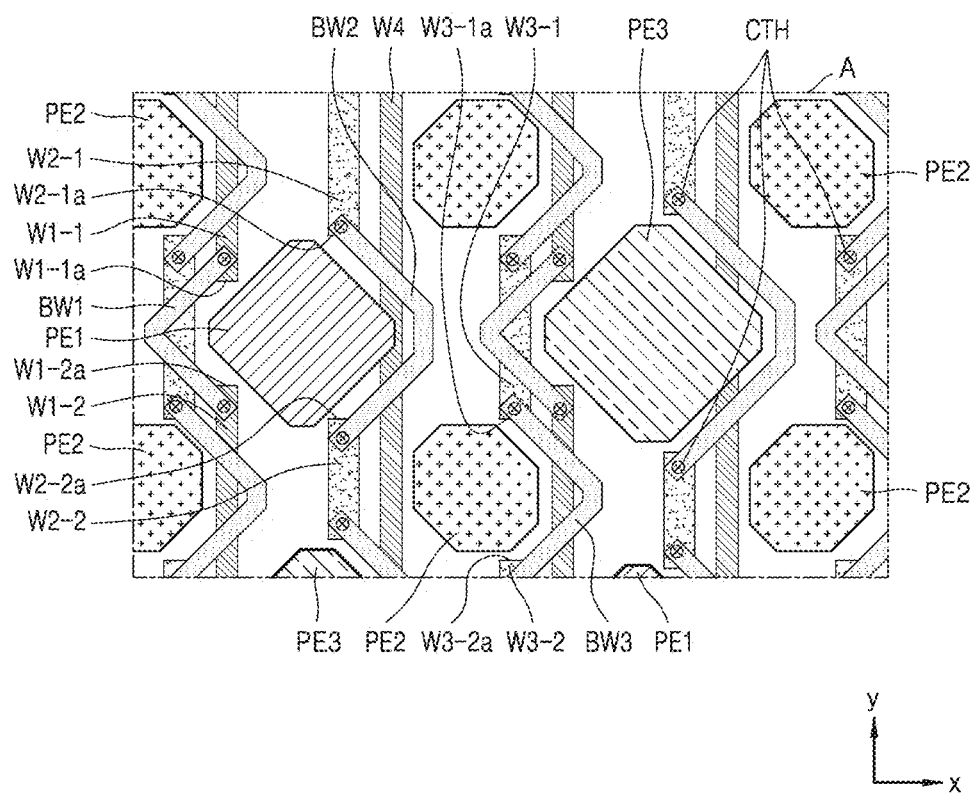
FIG. 17 is a plan view of another exemplary embodiment of a portion of a display device.

In an exemplary embodiment, as shown in FIG. 17, which is a plan view of another exemplary embodiment of a portion of the display device 1, the first bridge wiring BW1 and the second bridge wiring BW2 may be disposed near the first pixel electrode PE1, and the third bridge wiring BW3 may be disposed near the second pixel electrode PE2, for example.

The 1-$1^{st}$ wiring W1-1 extends in the first direction (the −y direction) and includes the 1-$1^{st}$ end W1-1a at an end portion thereof in the first direction. The 1-$2^{nd}$ wiring W1-2 faces the 1-$1^{st}$ end W1-1a by extending in the direction (the +y direction) opposite to the first direction (the −y direction). Therefore, the 1-$2^{nd}$ wiring W1-2 includes the 1-$2^{nd}$ end W1-2a apart from the 1-1st end W1-1a.

A 2-$1^{st}$ wiring W2-1 extends in the first direction (the −y direction) and is apart from the 1-$1^{st}$ wiring W1-1 and the 1-$2^{nd}$ wiring W1-2. The 2-$1^{st}$ wiring W2-1 includes a 2-$1^{st}$ end W2-1a at an end portion thereof in the first direction. The 2-$2^{nd}$ wiring W2-2 faces the 2-$1^{st}$ end W2-1a by extending in the direction (the +y direction) opposite to the first direction (the −y direction). Therefore, the 2-$2^{nd}$ wiring W2-2 includes a 2-$2^{nd}$ end W2-2a apart from the 2-$1^{st}$ end W2-1a.

The 3-$1^{st}$ wiring W3-1 extends in the first direction (the −y direction) and is disposed such that the 2-$1^{st}$ wiring W2-1 is between the 1-$1^{st}$ wiring W1-1 and the 3-$1^{st}$ wiring W3-1. The 3-$1^{st}$ wiring W3-1 includes the 3-$1^{st}$ end W3-1a at an end portion thereof in the first direction (the −x direction). The 3-$2^{nd}$ wiring W3-2 extends in the direction (the +y direction) opposite to the first direction (the −y direction) and includes the 3-$2^{nd}$ end W3-2a facing the 3-$1^{st}$ end W3-1a and being apart from the 3-$1^{st}$ end W3-1a.

The first bridge wiring BW1 is disposed on a layer different from a layer on which the 1-$1^{st}$ wiring W1-1, the 1-$2^{nd}$ wiring W1-2, the 2-$1^{st}$ wiring W2-1, the 2-$2^{nd}$ wiring W2-2, the 3-$1^{st}$ wiring W3-1, and the 3-$2^{nd}$ wiring W3-2 are disposed. That is, the 1-$1^{st}$ wiring W1-1, the 1-$2^{nd}$ wiring W1-2, the 2-$1^{st}$ wiring W2-1, the 2-$2^{nd}$ wiring W2-2, the 3-$1^{st}$ wiring W3-1, and the 3-$2^{nd}$ wiring W3-2 are disposed on the first insulating layer, and the first bridge wiring BW1 is disposed on a layer different from the first insulating layer. In an exemplary embodiment, the first bridge wiring BW1 may be disposed on the 2-$1^{st}$ insulating layer on the inter-insulating layer 130, which is the first insulating layer, for example. The 2-$1^{st}$ insulating layer may include, for example, the first planarization layer 141. That is, the first planarization layer 141 may cover the 1-$1^{st}$ wiring W1-1, the 1-$2^{nd}$ wiring W1-2, the 2-$1^{st}$ wiring W2-1, the 2-$2^{nd}$ wiring W2-2, the 3-$1^{st}$ wiring W3-1, and the 3-$2^{nd}$ wiring W3-2. The first bridge wiring BW1 may be disposed on the first planarization layer 141. The configuration of the first planarization layer 141 is the same as described above.

The first bridge wiring BW1 disposed over the first planarization layer 141, which is the 2-$1^{st}$ insulating layer, contacts the 1-$1^{st}$ wiring W1-1 and the 1-$2^{nd}$ wiring W1-2 to electrically connect the 1-$1^{st}$ wiring W1-1 to the 1-$2^{nd}$ wiring W1-2. In addition, as shown in FIG. 17, the first bridge wiring BW1 has a convex shape in the direction (the −x direction) opposite to the direction (the +x direction) from the 1-1st wiring W1-1 and the 1-2nd wiring W1-2 to the 2-$1^{st}$ wiring W2-1.

Similarly to the first bridge wiring BW1, the second bridge wiring BW2 disposed over the first planarization layer 141, which is the 2-$1^{st}$ insulating layer, contacts the 2-$1^{st}$ wiring W2-1 and the 2-$2^{nd}$ wiring W2-2 to electrically connect the 2-$1^{st}$ wiring W2-1 to the 2-$2^{nd}$ wiring W2-2. In addition, as shown in FIG. 17, the second bridge wiring BW2 has a convex shape in the direction (the +x direction) opposite to the direction (the −x direction) from the 2-$1^{st}$ wiring W2-1 and the 2-$2^{nd}$ wiring W2-2 to the 1-$1^{st}$ wiring W1-1.

Similarly to the first bridge wiring BW1, the third bridge wiring BW3 disposed over the first planarization layer 141, which is the 2-$1^{st}$ insulating layer, contacts the 3-$1^{st}$ wiring W3-1 and the 3-$2^{nd}$ wiring W3-2 to electrically connect the 3-$1^{st}$ wiring W3-1 to the 3-$2^{nd}$ wiring W3-2. In addition, as shown in FIG. 17, the third bridge wiring BW3 has a convex shape in the direction (the +x direction) opposite to the direction (the −x direction) from the 3-$1^{st}$ wiring W3-1 and the 3-$2^{nd}$ wiring W3-2 to the 2-$1^{st}$ wiring W2-1.

The first pixel electrode PE1 and the second pixel electrode PE2 are disposed over the second planarization layer 142, which is the 2-$2^{nd}$ insulating layer covering the first bridge wiring BW1 to the third bridge wiring BW3. One side of the first pixel electrode PE1 is disposed in a space between the 1-$1^{st}$ end W1-1a and the 1-$2^{nd}$ end W1-2a, and another side of the first pixel electrode PE1 is disposed in a space between the 2-$1^{st}$ end W2-1a and the 2-$2^{nd}$ end W2-2a. Therefore, the first pixel electrode PE1 has an approximately flat shape with respect to the substrate 100. One side of the second pixel electrode PE2 is disposed above a space between the 3-$1^{st}$ end W3-1a and the 3-$2^{nd}$ end W3-2a. Another side of the second pixel electrode PE2 may be disposed above a space between a center of a space between the 3-$1^{st}$ end W3-1a and the 3-$2^{nd}$ end W3-2a, and the 2-$1^{st}$ wiring W2-1, or disposed above a space between a center of a space between the 3-$1^{st}$ end W3-1a and the 3-$2^{nd}$ end W3-2a, and the 2-$2^{nd}$ wiring W2-2. Through this configuration, the second pixel electrode PE2 has a shape approximately parallel to the substrate 100.

As described above, the third bridge wiring BW3 has a convex shape in the direction (the +x direction) opposite to the direction (the −x direction) from the 3-$1^{st}$ wiring W3-1 and the 3-$2^{nd}$ wiring W3-2 to the 2-$1^{st}$ wiring W2-1. Therefore, it is preferable that a virtual straight line connecting the 3-$1^{st}$ wiring W3-1 to the 3-$2^{nd}$ wiring W3-2 passes below one side of the second pixel electrode PE2 in the direction (the +x direction) opposite to the direction (the −x direction) to the 2-$1^{st}$ wiring W2-1 or the direction (the +x direction) opposite to the direction (the −x direction) to the 2-$2^{nd}$ wiring W2-2, with respect to the center of the second pixel electrode PE2. Through this configuration, a total length of the third bridge wiring BW3 may be minimized.

In the illustrated exemplary embodiment of the display device, the 1-$1^{st}$ wiring W1-1 may include, for example, the data line, and the 2-$1^{st}$ wiring W2-1 may include, for example, the power line. That is, the 1-$1^{st}$ wiring W1-1 may include a data line which transfers a data signal to a pixel in which the first pixel electrode PE1 is disposed, and the 2-$1^{st}$ wiring W2-1 may include a power line which supplies power to a pixel in which the first pixel electrode PE1 is disposed. The fourth wiring W4 disposed between the 2-1$^{st}$ wiring W2-1 and the 3-1$^{st}$ wiring W3-1 may include, for example, a data line, and the 3-1$^{st}$ wiring W3-1 may include, for example, the power line. That is, the fourth wiring W4 may include a data line which transfers a data signal to a pixel in which the second pixel electrode PE2 is disposed, and the 3-1$^{st}$ wiring W3-1 may include a power line which supplies power to a pixel in which the second pixel electrode PE2 is disposed.

However, the invention is not limited thereto. In an exemplary embodiment, the first pixel electrode PE1 may be electrically connected to the second bridge wiring BW2, and the second pixel electrode PE2 may be electrically connected to the third bridge wiring BW3, for example. In this case, the wiring to which the first pixel electrode PE1 is electrically connected through the second bridge wiring BW2 may not be a data line or a power line and may be a wiring connected to one of a source electrode and a drain electrode of a TFT. In an alternative exemplary embodiment, the wiring to which the first pixel electrode PE1 is electrically connected may be one of the source electrode and the drain electrode of the TFT. In this case, the TFT may include a driving TFT or an emission control TFT. A wiring to which the second pixel electrode PE2 is electrically connected through the third bridge wiring BW3 may not be a data line or a power line and may be a wiring connected to one of a source electrode and a drain electrode of a TFT. In an alternative exemplary embodiment, the wiring to which the second pixel electrode PE2 is electrically connected may be one of the source electrode and the drain electrode of the TFT.

In this case, a second via hole and a third via hole are defined in the second planarization layer 142, which is the 2-2$^{nd}$ insulating layer. The second via hole is defined over the second bridge wiring BW2, and the third via hole is defined over third bridge wiring BW3. Therefore, the first pixel electrode PE1 may contact the second bridge wiring BW2 through the second via hole, and the second pixel electrode PE2 may contact the third bridge wiring BW3 through the third via hole.

Figure 18:
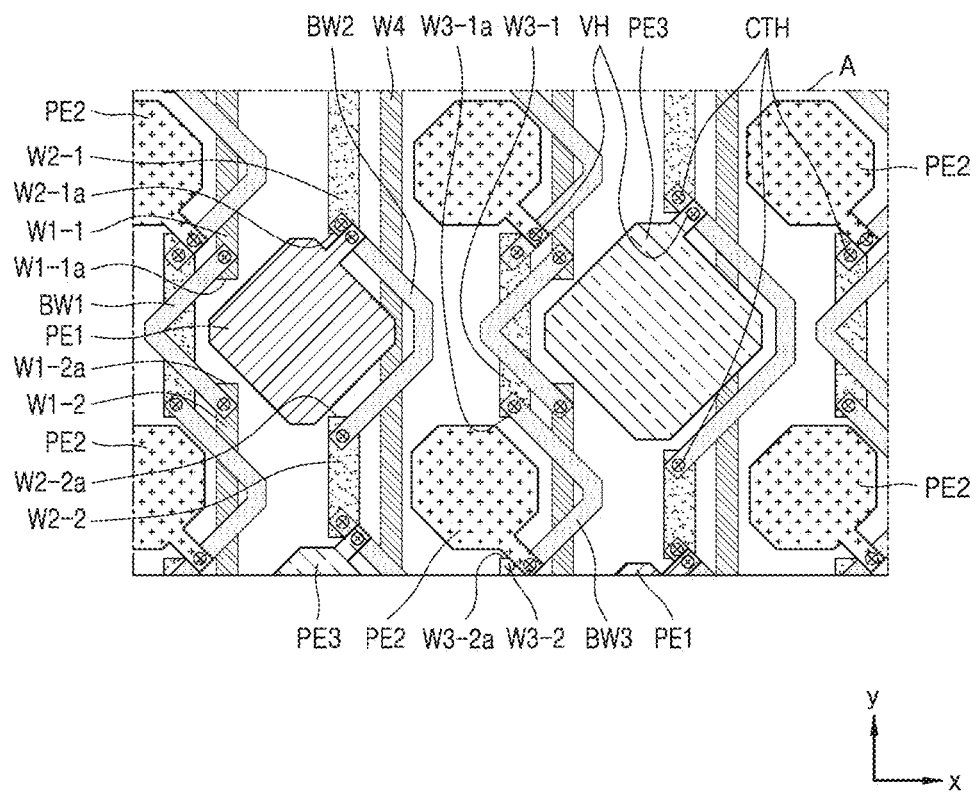
FIG. 18 is a plan view of another exemplary embodiment of a portion of a display device.

When the first pixel electrode PE1 contacts the second bridge wiring BW2 through the second via hole, and the second pixel electrode PE2 contacts the third bridge wiring BW3 through the third via hole, the locations of the via holes may correspond to outer edges, not emission areas of the pixel electrodes. Furthermore, as shown in FIG. 18, which is a plan view of another exemplary embodiment of a portion of the display device 1, the first pixel electrode PE1 may include protrusions protruding in the +x direction and the +y direction and contact the second bridge wiring BW2 through the second via holes defined in places where the protrusions are disposed. In addition, the second pixel electrode PE2 may include protrusions protruding in the +x direction and the −y direction and contact the third bridge wiring BW3 through the third via holes defined in places where the protrusions are disposed. Like the first pixel electrode PE1, the third pixel electrode PE3 may include protrusions protruding in the +x direction and the +y direction and contact a bridge wiring corresponding thereto through the via holes defined in places where the protrusions are disposed. For reference, in FIG. 18, all via holes are represented by a reference character VH, for convenience of description.

To allow the first pixel electrode PE1 not to be inclined with respect to the substrate 100, a top surface of the second planarization layer 142 is made to have an approximately flat shape between the 1-1$^{st}$ end W1-1a and the 1-2$^{nd}$ end W1-2a by making the 1-1$^{st}$ end W1-1a apart from the 1-2$^{nd}$ end W1-2a, and a top surface of the second planarization layer 142 is made to have an approximately flat shape between the 2-1$^{st}$ end W2-1a and the 2-2$^{nd}$ end W2-2a by making the 2-1$^{st}$ end W2-1a apart from the 2-2$^{nd}$ end W2-2a. To allow the second pixel electrode PE2 not to be inclined with respect to the substrate 100, a top surface of the second planarization layer 142 is made to have an approximately flat shape between the 3-1$^{st}$ end W3-1a and the 3-2$^{nd}$ end W3-2a by making the 3-1$^{st}$ end W3-1a apart the 3-2$^{nd}$ end W3-2a. For this purpose, it is desired that an orthogonal projection image of the first pixel electrode PE1 onto the substrate 100 does not overlap an orthogonal projection image of the first bridge wiring BW1 and the second bridge wiring BW2 onto the substrate 100. In addition, it is desired that an orthogonal projection image of the second pixel electrode PE2 onto the substrate 100 does not overlap an orthogonal projection image of the third bridge wiring BW3 onto the substrate 100.

According to the exemplary embodiments, the display device in which a degree of the occurrence of a color band by external light reflection may be reduced may be implemented. The scope of the invention is not limited by this effect.

It should be understood that embodiments described herein should be considered in a descriptive sense only and not for purposes of limitation. Descriptions of features within each embodiment should typically be considered as available for other similar features in other exemplary embodiments. While one or more embodiments have been described with reference to the drawing figures, it will be understood by those of ordinary skill in the art that various changes in form and details may be made therein without departing from the spirit and scope of the invention.

What is claimed is:

1. A display device comprising:
   a 1-1$^{st}$ wiring disposed over a first insulating layer, extending in a first direction and including a 1-1$^{st}$ end at an end portion thereof in the first direction;
   a 1-2$^{nd}$ wiring disposed over the first insulating layer, extending in a second direction opposite to the first direction, and including a 1-2$^{nd}$ end which faces the 1-1$^{st}$ end, the 1-2$^{nd}$ end being apart from the 1-1$^{st}$ end;
   a second wiring disposed over the first insulating layer, extending in the first direction to correspond to the 1-1$^{st}$ wiring and the 1-2$^{nd}$ wiring, the second wiring being apart from the 1-1$^{st}$ wiring and the 1-2$^{nd}$ wiring;
   a first bridge wiring disposed on a layer different from the first insulating layer, contacting the 1-1$^{st}$ wiring and the 1-2$^{nd}$ wiring, electrically connecting the 1-1$^{st}$ wiring to the 1-2$^{nd}$ wiring, and having a convex shape in a direction opposite to a direction from the 1-1$^{st}$ wiring and the 1-2$^{nd}$ wiring to the second wiring;
   a third wiring disposed over the first insulating layer such that the second wiring is between the third wiring and 1-1$^{st}$ wiring, the third wiring extending in the first direction and corresponding to the 1-1$^{st}$ wiring and the 1-2$^{nd}$ wiring;
   a first pixel electrode including a first side and a second side, the first side being disposed above the second wiring in a cross-sectional view and overlapping the second wiring in a plan view, the second side being disposed above a space between the 1-1$^{st}$ end and the 1-2$^{nd}$ end in the cross-sectional view and overlapping the space between the 1-1$^{st}$ end and the 1-2$^{nd}$ end in the plan view; and a second pixel electrode including a first side and a second side, the first side being disposed above the third wiring in the cross-sectional view and overlapping the third wiring in the plan view, the second side being disposed above a space between the second wiring and the third wiring in the cross-sectional view and overlapping the space between the second wiring and the third wiring in the plan view.

2. The display device of claim 1, wherein the first pixel electrode is electrically connected to the second wiring, and the second pixel electrode is electrically connected to the third wiring.

3. The display device of claim 1, further comprising:
a $2\text{-}1^{st}$ insulating layer covering the $1\text{-}1^{st}$ wiring, the $1\text{-}2^{nd}$ wiring, the second wiring, and the third wiring; and
a $2\text{-}2^{nd}$ insulating layer over the $2\text{-}1^{st}$ insulating layer,
wherein the first bridge wiring is between the $2\text{-}1^{st}$ insulating layer and the $2\text{-}2^{nd}$ insulating layer.

4. The display device of claim 3, wherein a $2\text{-}1^{st}$ via hole and a $3\text{-}1^{st}$ via hole are defined in the $2\text{-}1^{st}$ insulating layer, the $2\text{-}1^{st}$ via hole being defined over the second wiring, the $3\text{-}1^{st}$ via hole being defined over the third wiring,
a $2\text{-}2^{nd}$ via hole and a $3\text{-}2^{nd}$ via hole are defined in the $2\text{-}2^{nd}$ insulating layer, the $2\text{-}2^{nd}$ via hole corresponding to the $2\text{-}1^{st}$ via hole, the $3\text{-}2^{nd}$ via hole corresponding to the $3\text{-}1^{st}$ via hole,
the first pixel electrode is in contact with the second wiring through the $2\text{-}1^{st}$ via hole and the $2\text{-}2^{nd}$ via hole, and
the second pixel electrode is in contact with the third wiring through the $3\text{-}1^{st}$ via hole and the $3\text{-}2^{nd}$ via hole.

5. The display device of claim 1, further comprising a substrate over which the first insulating layer is arranged,
wherein an orthogonal projection image of the first pixel electrode on the substrate does not overlap an orthogonal projection image of the first bridge wiring on the substrate.

6. The display device of claim 5, wherein an orthogonal projection image of the second pixel electrode on the substrate does not overlap an orthogonal projection image of the second wiring on the substrate.

7. The display device of claim 1, further comprising a second insulating layer covering the $1\text{-}1^{st}$ wiring, the $1\text{-}2^{nd}$ wiring, the second wiring, and the third wiring,
wherein the first bridge wiring, the first pixel electrode, and the second pixel electrode are arranged over the second insulating layer such that the first bridge wiring, the first pixel electrode, and the second pixel electrode do not contact one another.

8. The display device of claim 7, wherein a second via hole is defined in the second insulating layer over the second wiring and a third via hole is defined in the second insulating layer over the third wiring,
the first pixel electrode is in contact with the second wiring through the second via hole, and
the second pixel electrode is in contact with the third wiring through the third via hole.

9. The display device of claim 7, further comprising a substrate over which the first insulating layer is arranged,
wherein an orthogonal projection image of the first pixel electrode on the substrate does not overlap an orthogonal projection image of the first bridge wiring on the substrate, and an orthogonal projection image of the second pixel electrode on the substrate does not overlap an orthogonal projection image of the second wiring on the substrate.

* * * * *